United States Patent
Gu et al.

(10) Patent No.: US 10,304,792 B1
(45) Date of Patent: May 28, 2019

(54) SEMICONDUCTOR PACKAGE HAVING REDUCED INTERNAL POWER PAD PITCH

(71) Applicant: Futurewei Technologies, Inc., Plano, TX (US)

(72) Inventors: Shiqun Gu, San Diego, CA (US); Hongying Zhang, Shanghai (CN); HongLiang Cai, Shanghai (CN)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/814,736

(22) Filed: Nov. 16, 2017

(51) Int. Cl.
*H01L 21/44* (2006.01)
*H01L 23/00* (2006.01)
*H01L 21/768* (2006.01)

(52) U.S. Cl.
CPC ........ *H01L 24/09* (2013.01); *H01L 21/76843* (2013.01); *H01L 21/76873* (2013.01); *H01L 24/03* (2013.01); *H01L 24/06* (2013.01); *H01L 2224/0231* (2013.01); *H01L 2224/02331* (2013.01); *H01L 2224/02379* (2013.01); *H01L 2224/0347* (2013.01); *H01L 2924/15174* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 6,727,597 | B2 * | 4/2004 | Taylor | H01L 23/49838 257/207 |
| 7,075,185 | B2 * | 7/2006 | Nelson | H01L 23/49838 257/532 |
| 8,753,939 | B2 * | 6/2014 | Law | H01L 23/481 257/774 |

(Continued)

FOREIGN PATENT DOCUMENTS

| | | |
|---|---|---|
| CN | 101005058 A | 7/2007 |
| CN | 104795382 A | 7/2015 |

(Continued)

OTHER PUBLICATIONS

International Search Authority; International Search Report and Written Opinion; PCT/CN2018/115051; Feb. 15, 2019; 9 pgs.

*Primary Examiner* — Hung K Vu
(74) *Attorney, Agent, or Firm* — Garlick & Markison; Bruce Garlick

(57) ABSTRACT

A packaged Integrated Circuit (IC) includes an IC and a package. The package has a bottom dielectric layer and a plurality of redistribution layers (RDLs) formed on the bottom dielectric layer. Each the RDLs includes patterned conductors, a dielectric layer, and a plurality of vias that extend between the patterned conductors to a differing RDL or to external connections. The package includes a plurality of package pads that have a first lateral separation pitch. The IC includes a plurality of IC pads that electrically connect to the plurality of package pads that have a first lateral separation pitch. The package also includes a plurality of Printed (Continued)

Circuit Board (PCB) pads that extend through the bottom dielectric layer and contact the plurality of patterned conductors of the first RDL. Power PCB pads and ground PCB pads of the plurality of PCB pads have a second lateral separation pitch that exceeds the first lateral separation pitch.

9 Claims, 27 Drawing Sheets

(56) References Cited

U.S. PATENT DOCUMENTS

| | | |
|---|---|---|
| 2007/0164429 A1 | 7/2007 | Lee |
| 2014/0217616 A1* | 8/2014 | Choi ..................... H01L 22/20 257/777 |
| 2015/0206855 A1 | 7/2015 | Lin |
| 2016/0322337 A1 | 11/2016 | Liang et al. |

FOREIGN PATENT DOCUMENTS

| | | |
|---|---|---|
| CN | 106098665 A | 11/2016 |
| CN | 106653703 A | 5/2017 |

* cited by examiner

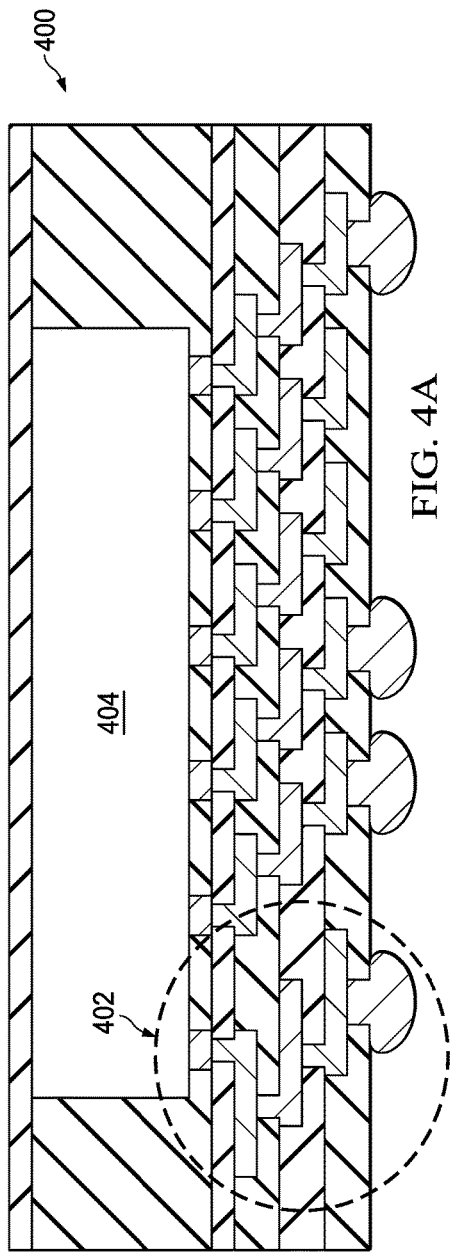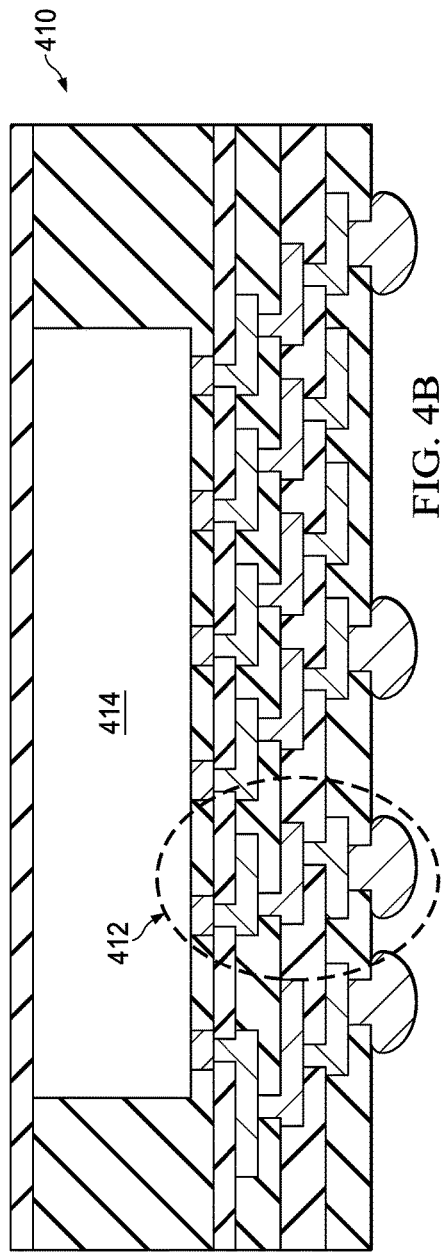

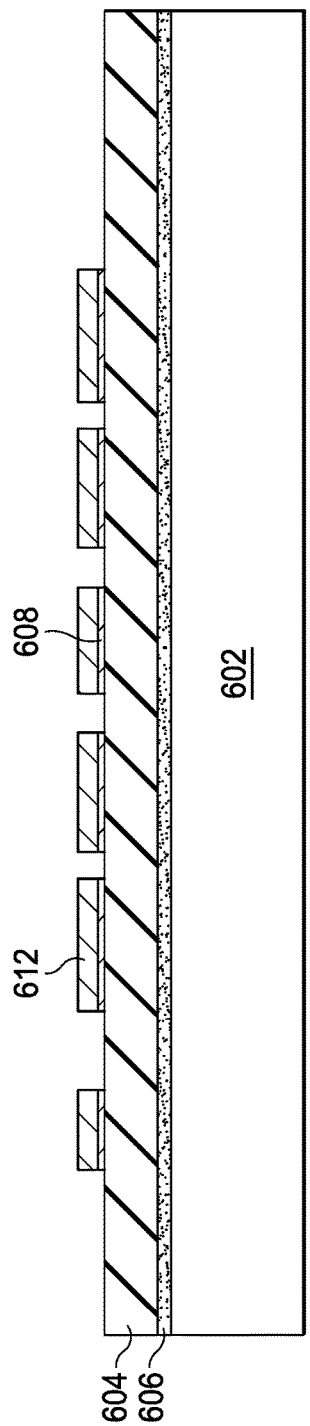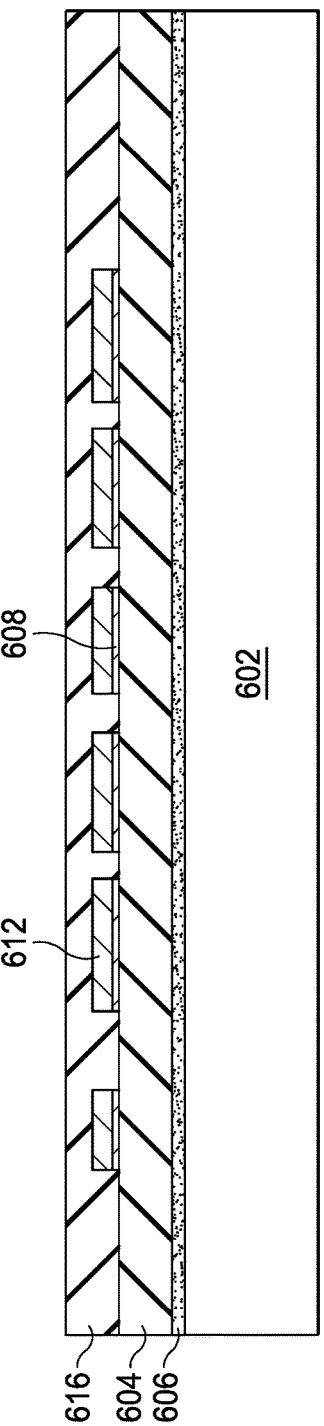
FIG. 6E
FIG. 6F

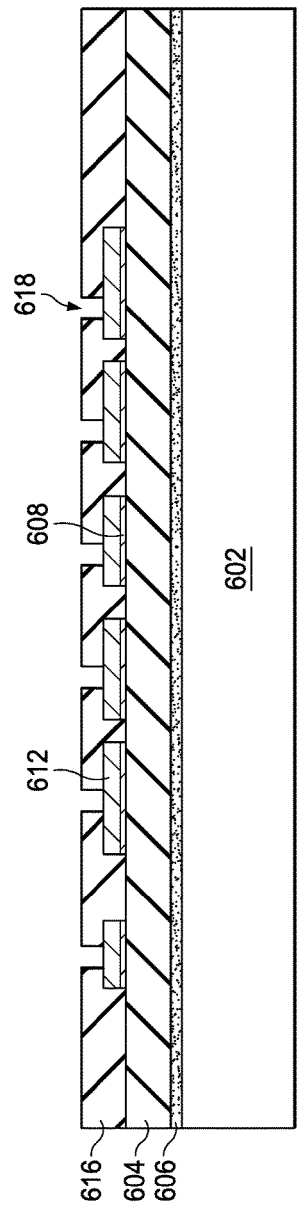
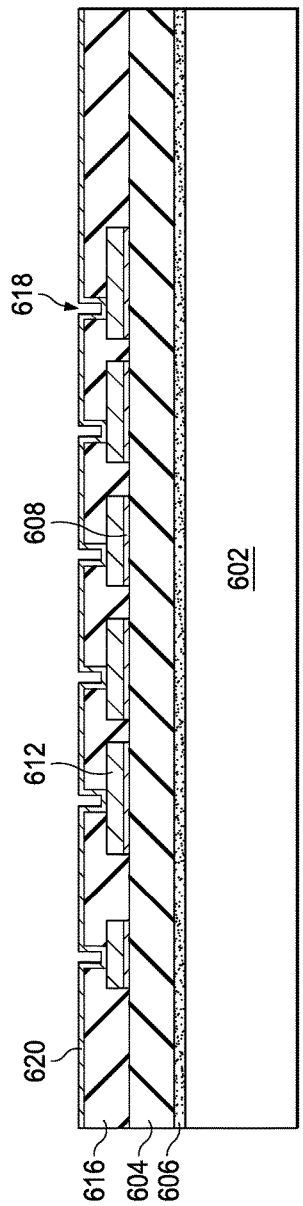
FIG. 6G
FIG. 6H

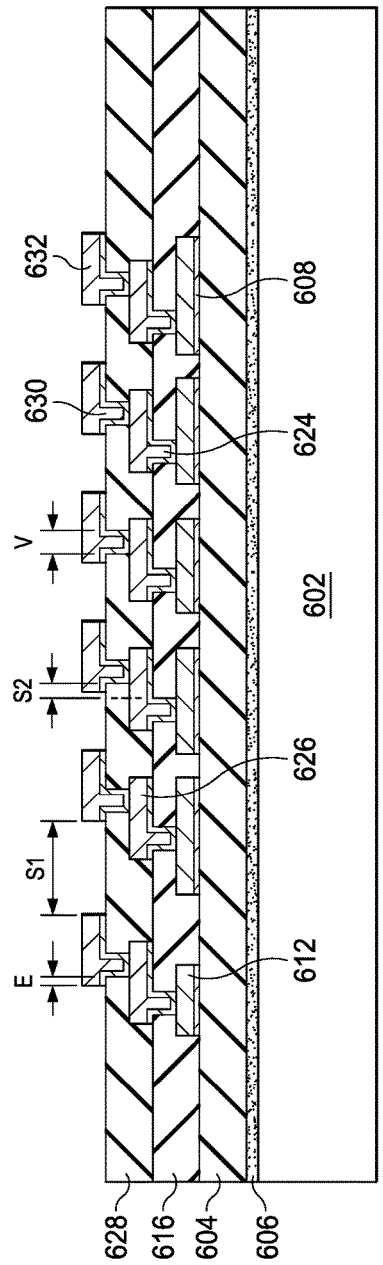
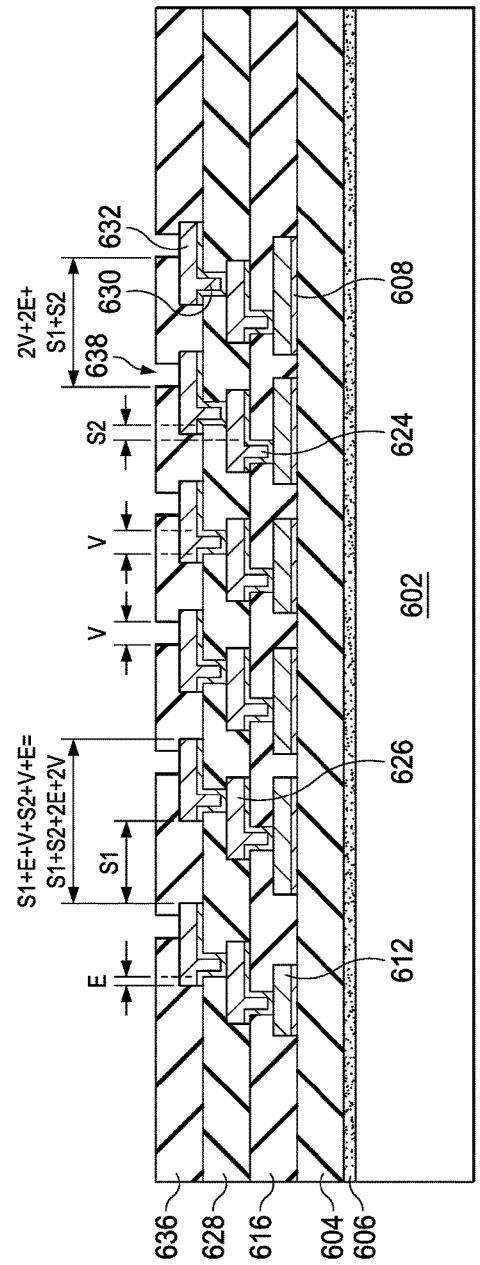
FIG. 6K
FIG. 6L

US 10,304,792 B1

SEMICONDUCTOR PACKAGE HAVING REDUCED INTERNAL POWER PAD PITCH

BACKGROUND OF THE INVENTION

Integrated Circuit (IC) technology has advanced greatly over the past fifty years. ICs are now pervasive and present in electronic devices, machinery, vehicles, appliances, and many other devices. Large processing ICs now include billions of transistors while memory ICs include hundreds of billions of transistors. The density of transistors on ICs can reach 100 million transistors per square millimeter.

Transistors of the ICs are formed in a semi conducive portion of the IC and are interconnected by patterned conductors formed in ten or more metal layers of the IC. Such interconnection of the transistors creates logic functions. The metal layers are also used to route signals within the IC, to route signals external to the IC, and to distribute supply voltages to the transistors, e.g., source supply voltage ($V_{SS}$) and drain supply voltage ($V_{DD}$), often referred to as power and ground, respectively. Distribution of $V_{SS}$ and $V_{DD}$ within an IC uses patterned conductors formed in one or more metal layers and vias that intercouple the metal layers. Because of dimensional constraints in the metal layers, the patterned conductors may have relatively high serial resistance. The flow of current through these patterned conductors therefore results in IR drop (voltage drop) which lowers voltage applied to transistors reducing circuit performance and generating heat during power delivery. While the voltage drop reduces the performance of the IC, generated heat must be dissipated to avoid destruction of the IC. The IR drop at edges of power domains may be greater because of the longer conductor lengths servicing transistors at the boundaries of the power domains.

FIG. 1A is a diagram illustrating a pattern of package pads of a prior flip chip package. The package pads of the package are electrical connections, e.g., conductive pads, that correspond directly to and electrically connect with the electrical connections of the IC. The package also includes a secondary interface, e.g., Printed Circuit Board (PCB) interface. The PCB interface includes electrical connections, e.g., solder balls, that correspond directly to the electrical connections on a PCB upon which the package mounts.

As shown in FIG. 1A, the flip chip package 100 includes a plurality of I/O pads 102 for connecting to I/O connections of an IC and a plurality of internal power/ground pads 104 for connecting to $V_{SS}$ and $V_{DD}$ connections of the IC. Current flip chip packaging technology supports lateral separation pitches between I/O pads 102 down to 60 microns and lateral separation pitches between interposers down to 40 microns. However, current flip chip packaging technology only supports lateral separation pitches between internal power/ground pads 104 down to 200 microns. Because of this, $V_{SS}$ and $V_{DD}$ must be laterally distributed within the IC as described above, causing the problems discussed. The terms "lateral separation pitch" and "pitch" are used interchangeably herein.

FIG. 1B is a sectional side view illustrating a portion of a prior packaged IC 150. Fiber glass core 162 is used as a basis for the IC package. Vias 174 and 188 are formed in the core 162 via laser drilling and filling with a conductive material, e.g., copper. Patterned conductors 172, 176, 187 and 190 are formed on the core 162. Dielectric layers 160 and 164 are formed on the core 162 to insulate the patterned conductors 172, 176, 187 and 190. Next, holes are laser drilled in the dielectric layers 160 and 164 and vias 170, 186, 177 and 191 are formed therein to couple to patterned conductors 172, 187, 176 and 190, respectively. Dielectric layers 158 and 166 insulate patterned conductors 168, 178, 184, and 192. Package pads 180 and 194 include bumps (e.g., solder bumps or Cu pads) and conductive vias that extend through dielectric layer 166 to patterned conductors 178 and 192. An IC 156 includes IC pads 182 and 196 that electrically couple to package pads 180 and 194, respectively. Printed Circuit Board (PCB) pads 152 and 154 electrically couple to conductors 168 and 184, respectively, through dielectric layer 158. The PCB pads may be solder balls. The packaged IC 150 may be mounted on a PCB (not shown) with the PCB pads 152 and 154 electrically coupling the packaged IC 150 to the PCB.

The laser drilling techniques used to construct the prior IC package of FIGS. 1A and 1B limit dimensions of vias to a minimum diameter of approximately 50-60 microns. The position accuracy of the laser drill is about 30 microns. Therefore, the minimum via pad size is limited to approximately 110 to 120 microns. Dimensions of the patterned conductors are limited by the dimensions of the via pad. Thus, prior IC packages typically had lateral separation pitch between internal power/ground package pads of 200 microns, and a minimum of 150 microns. Such construct resulted in the distribution of power and ground within the IC greater than 200 microns from the bumps, generating heat and voltage degradation. Further, dielectric layers of IC packages upon which the package pads were formed were typically not perfectly planar, which put stress on the ICs in response to being mounted to the IC packages. What is needed, therefore, is an improved IC package with reduced lateral separation pitches between power/ground pads.

SUMMARY

According to a first aspect of the present disclosure, a packaged IC includes a bottom dielectric layer and, on the bottom dielectric layer, a first RDL having a first plurality of patterned conductors and a first dielectric layer. The packaged IC includes, on the first RDL, a second RDL having a second plurality of patterned conductors, a second dielectric layer, and a first plurality of vias that extend through the second dielectric layer between the first plurality of patterned conductors and the second plurality of patterned conductors. The packaged IC also includes, on the second RDL, a third RDL having a third plurality of patterned conductors, a third dielectric layer, and a second plurality of vias that extend through the third dielectric layer between the second plurality of patterned conductors and the third plurality of patterned conductors. The packaged IC includes a plurality of package pads that extend from the third plurality of patterned conductors through the third dielectric layer, power pads and ground pads of the plurality of package pads opening having a first lateral separation pitch. An IC of the packaged IC electrically connects to the plurality of package pads and is encapsulated in an IC encapsulation. A plurality of PCB pads extends through the bottom dielectric layer and contact the first plurality of patterned conductors, power PCB pads and ground PCB pads of the plurality of PCB pads having a second lateral separation pitch that exceeds the first lateral separation pitch.

According to a second aspect of the present disclosure, a method for creating a packaged IC includes forming a bottom dielectric layer on a planar carrier and, on the bottom dielectric layer, forming a first RDL having a first plurality of patterned conductors and a first dielectric layer. The method includes, on the first RDL, forming a second RDL having a second plurality of patterned conductors, a second dielectric layer, and a first plurality of vias that extend through the second dielectric layer between the first plurality of patterned conductors and the second plurality of patterned conductors. The method further includes, on the second RDL, forming a third RDL having a third plurality of patterned conductors, a third dielectric layer, and a second plurality of vias that extend through the third dielectric layer between the second plurality of patterned conductors and the third plurality of patterned conductors. The method also includes forming a plurality of package pad openings that extend from the third plurality of patterned conductors through the third dielectric layer and forming a plurality of package pads that extend into the plurality of package pad openings, power package pads and ground package pads internal of the chip of the plurality of package pads having a first lateral separation pitch, electrically connecting an IC to the plurality of package pads. The method further includes encapsulating the IC with a protective encapsulant, removing the planar carrier from the bottom dielectric layer, and forming a plurality of PCB pads that extend through the bottom dielectric layer and contact the first plurality of patterned conductors, power PCB pads and ground PCB pads of the plurality of PCB pads having a second lateral separation pitch that exceeds the first lateral separation pitch.

According to a third aspect of the present disclosure, a method for creating a packaged IC includes forming a bottom dielectric layer on a planar carrier and securing an IC to the bottom dielectric layer, the IC having a plurality of IC pads opposite the bottom dielectric layer having a first lateral separation pitch. The method includes encapsulating the IC with a protective encapsulant, exposing the plurality of IC pads, and forming a first RDL on the protective encapsulant, the first RDL having a first dielectric layer formed on the protective encapsulant, a first plurality of patterned conductors formed on the first dielectric layer, and a first plurality of vias that extend through the first dielectric layer from the first plurality of patterned conductors to the plurality of IC pads. The method includes forming a second RDL on the first RDL, the second RDL having a second dielectric layer formed on the first RDL, a second plurality of patterned conductors formed on the second dielectric layer, and a second plurality of vias that extend from the second plurality of patterned conductors to the first plurality of patterned conductors through the second dielectric layer. The method also includes forming a third RDL on the second RDL, the third RDL having a third dielectric layer formed on the second RDL, a third plurality of patterned conductors formed on the third dielectric layer, and a third plurality of vias that extend from the third plurality of patterned conductors to the second plurality of patterned conductors through the third dielectric layer. The method then includes forming a fourth dielectric layer on the third RDL, forming a plurality of PCB package pad openings that extend through the fourth dielectric layer to the third plurality of patterned conductors, and forming a plurality of PCB pads that extend through the plurality of PCB package pad openings to the third plurality of patterned conductors, power PCB pads and ground PCB pads of the plurality of PCB pads having a second lateral separation pitch that exceeds the first lateral separation pitch.

Thus, according to each of the first, second and third aspects, the lateral separation of the IC pads/package pads is much smaller than prior structures supported. For example, with the aspects described herein, the IC pads/package pads lateral separation may be on the order of 40 to 150 microns (or less), as compared to the minimum lateral separation of IC pads/package pads of prior structures of 150 to 250 microns. The reduction of the lateral separation of the IC pads/package pads resulted in significant reduction of IR drop for power and ground within the IC that is packaged. This reduction in IR drop not only results in larger transistor voltage but also reduction in heating generated due to the IR drop. These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

FIG. 4A is partial sectional side view illustrating aspects of a packaged IC according to an embodiment of the present disclosure.

FIG. 4B is a partial sectional side view illustrating aspects of a differing packaged IC according to an embodiment of the present disclosure.

DETAILED DESCRIPTION

It should be understood at the outset that, although illustrative implementations of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1A:
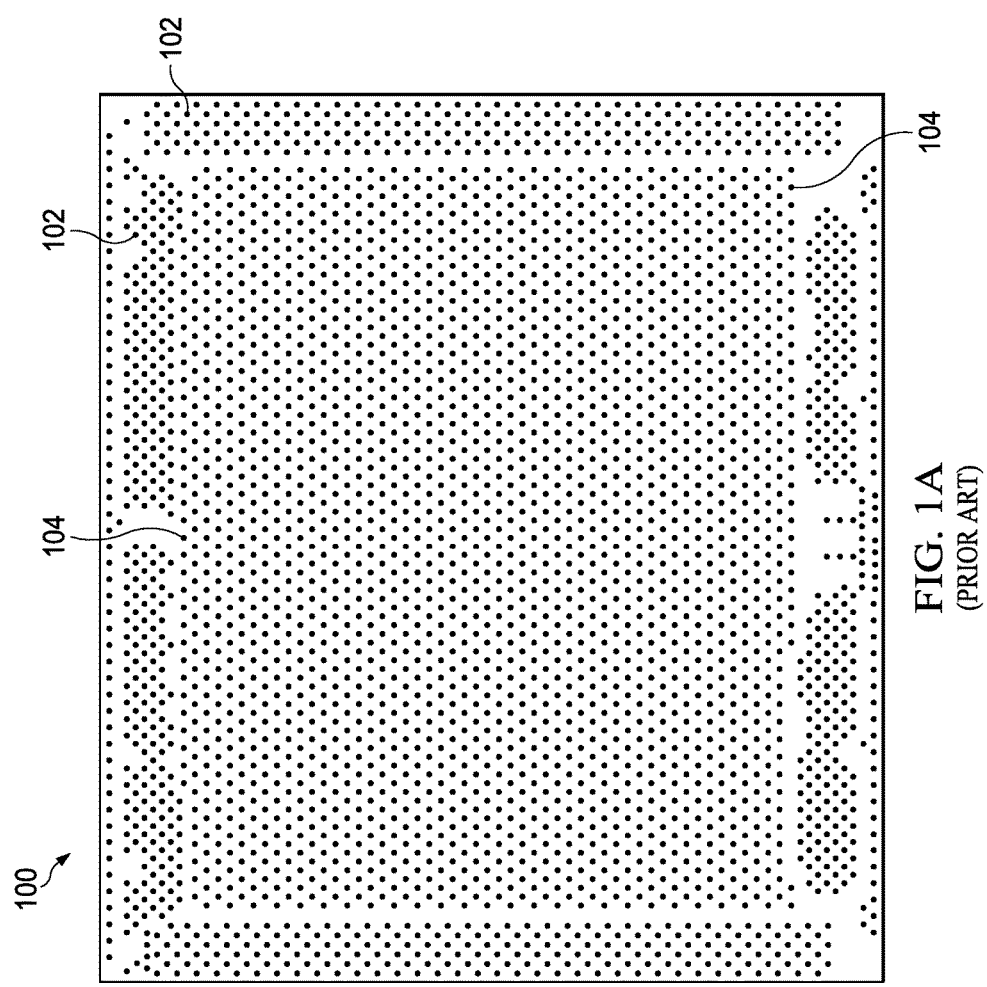
FIG. 1A is a diagram illustrating a pattern of package pads of a prior flip chip package.
Figure 1B:
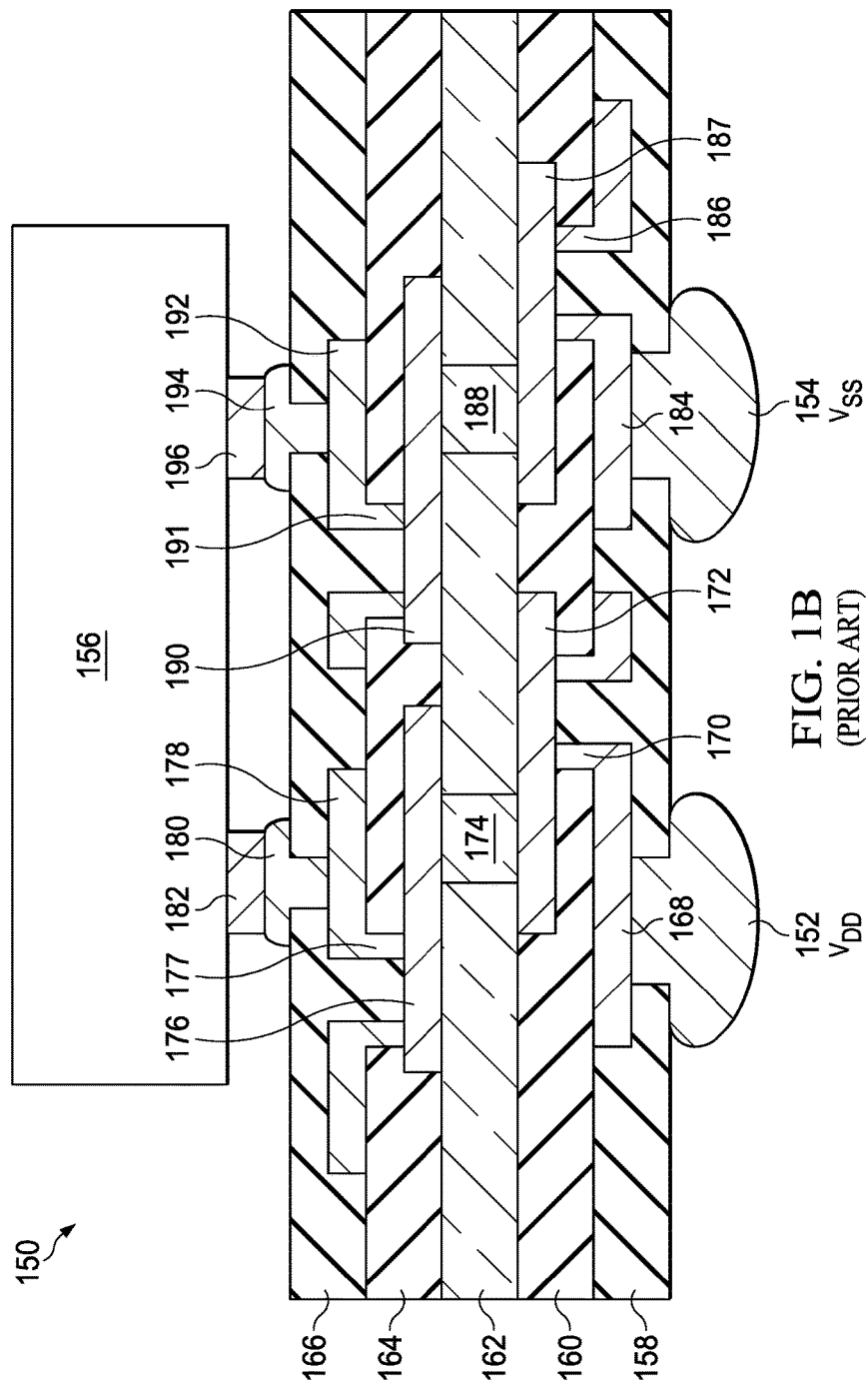
FIG. 1B is a sectional side view illustrating a portion of a prior packaged IC.
Figure 2A:
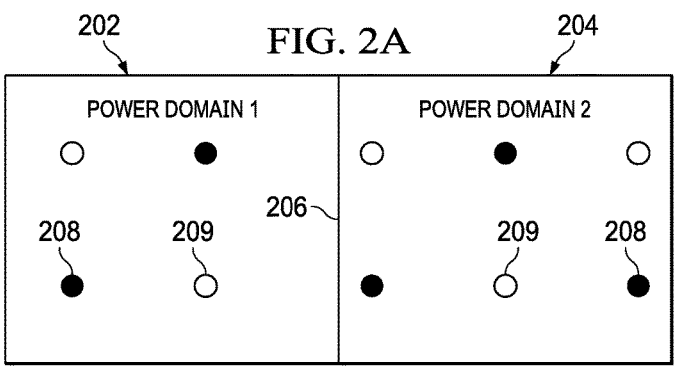
FIG. 2A is a block diagram illustrating power domains of an IC.

FIG. 2A is a block diagram illustrating power domains of an IC. Illustrated are a first power domain 202 and a second power domain 204. To reduce overall IC power consumption, one or both power domains 202 and 204 may be selectively shut down or operated at a reduced voltage. Also shown in FIG. 2A are power connections 208 and ground connections 209 of the IC, e.g., IC pads. The power connections 208 are shown as solid black circles while the ground connections 209 are shown as hollow circles. A boundary 206 between power domains 202 and 204 is selected based upon locations of transistors that are to have their power commonly controlled. However, the selection of this boundary 206 causes transistors near the boundary 206 within power domain 202 to be serviced by power connections 208 and ground connections 209 that are relatively far away, as compared to other transistors within the power domain 202. Thus, transistors at this boundary 206 of power domain 202 are most susceptible to high voltage drop with resultant increased IR heating.

Figure 2B:
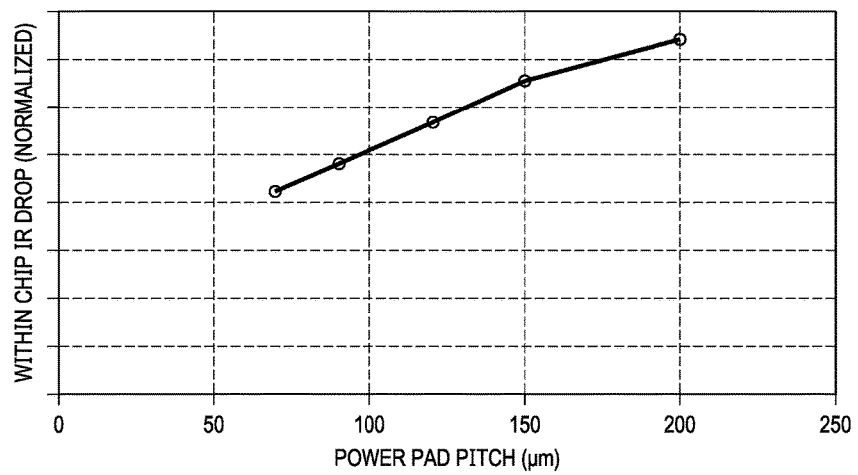
FIG. 2B is a graph illustrating IR drop versus IC power pad/ground pad lateral separation pitch.

FIG. 2B is a graph illustrating IR drop versus IC power pad/ground pad lateral separation pitch. According to the present disclosure, various structures and methods are disclosed that cause the lateral separation pitch of IC power pads and IC ground pads of an IC package to be much smaller than with prior IC packages. Thus, with the IC package of the present disclosure, the lateral separation pitch between IC power pads and IC ground pads of a packaged IC are also reduced. Such reduction in lateral separation pitch of IC power pads and IC ground pads allows power and ground conductors routed in metal layers of the IC to have shorter distances with reduced IR voltage drop and, resultantly, less heat generated. Note that the normalized IR drop of an IC having IC power and ground pad lateral separation pitch that is reduced from 200 microns to approximately 70 microns is significant.

Figure 2C:
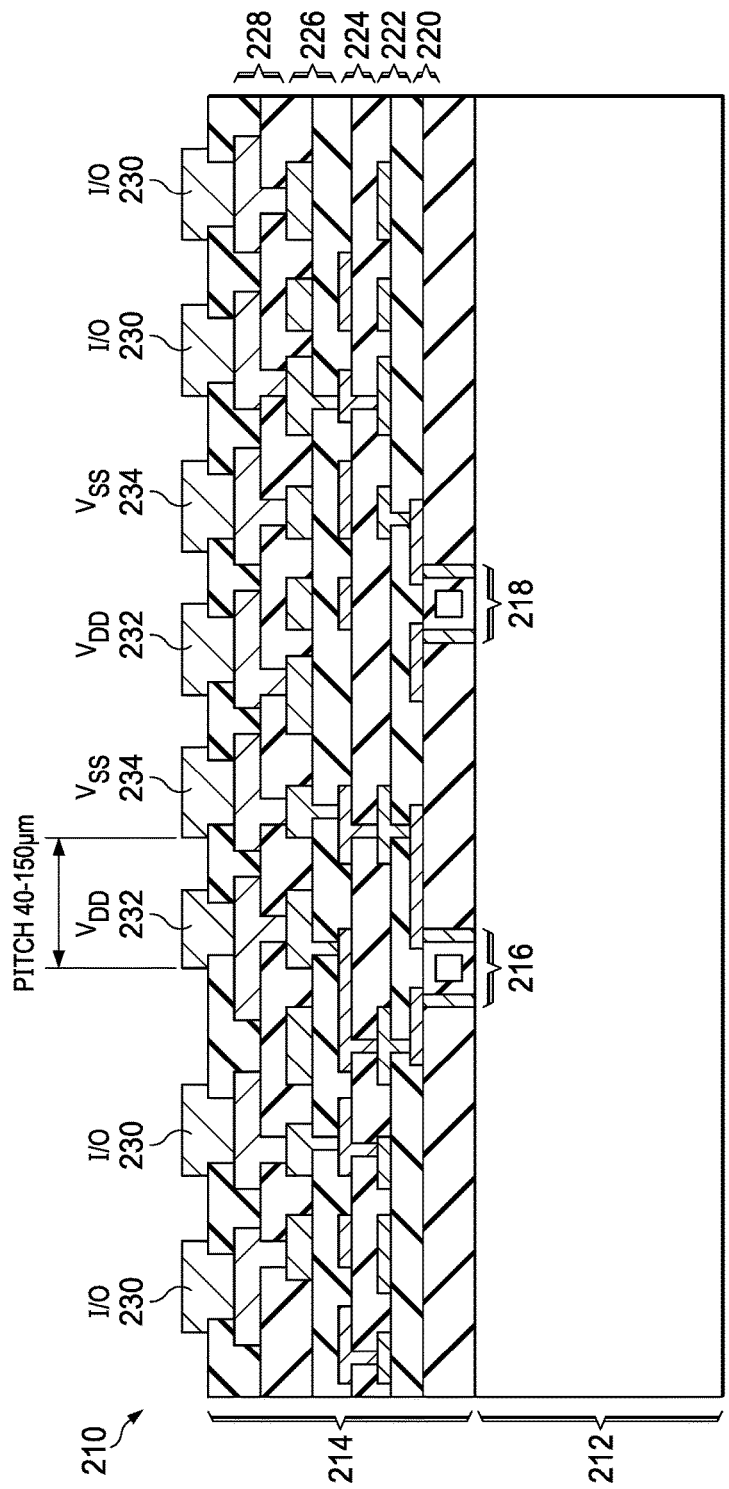
FIG. 2C is partial sectional side view illustrating an IC that may be packaged according to an embodiment of the present disclosure.

FIG. 2C is partial sectional side view illustrating an IC that may be packaged according to an embodiment of the present disclosure. The IC 210 includes a semi conductive substrate 212 formed of silicon or another semiconductor. Transistors 216 and 218 are formed in the semi conductive substrate 212 using known techniques. A plurality of metal layers 214, including metal layers 220, 222, 224, 226, and 228 include conductors and vias that route power, ground, and signals within the IC 210. In the example of FIG. 2C, metal layers 220, 222, 224, and 226 include copper conductors while metal layer 228 may include aluminum conductors as an option. IC signal pads 230 route signals into and out of the IC 210. IC power pads 232 and IC ground pads 234 provide power and ground, respectively, to the IC 210. According to aspects of the present disclosure, the IC power pads 232 and IC ground pads 234 have reduced lateral separation pitch down to 40 microns as compared to prior ICs because an IC package of the present disclosure supports such reduced lateral separation pitch. The power pad lateral separation pitch reduction on the chip should be matched with the package pad lateral separation pitch on package, which will be explained in following paragraphs. The terms "lateral separation pitch" and "pitch" are used interchangeably herein.

Figure 3A:
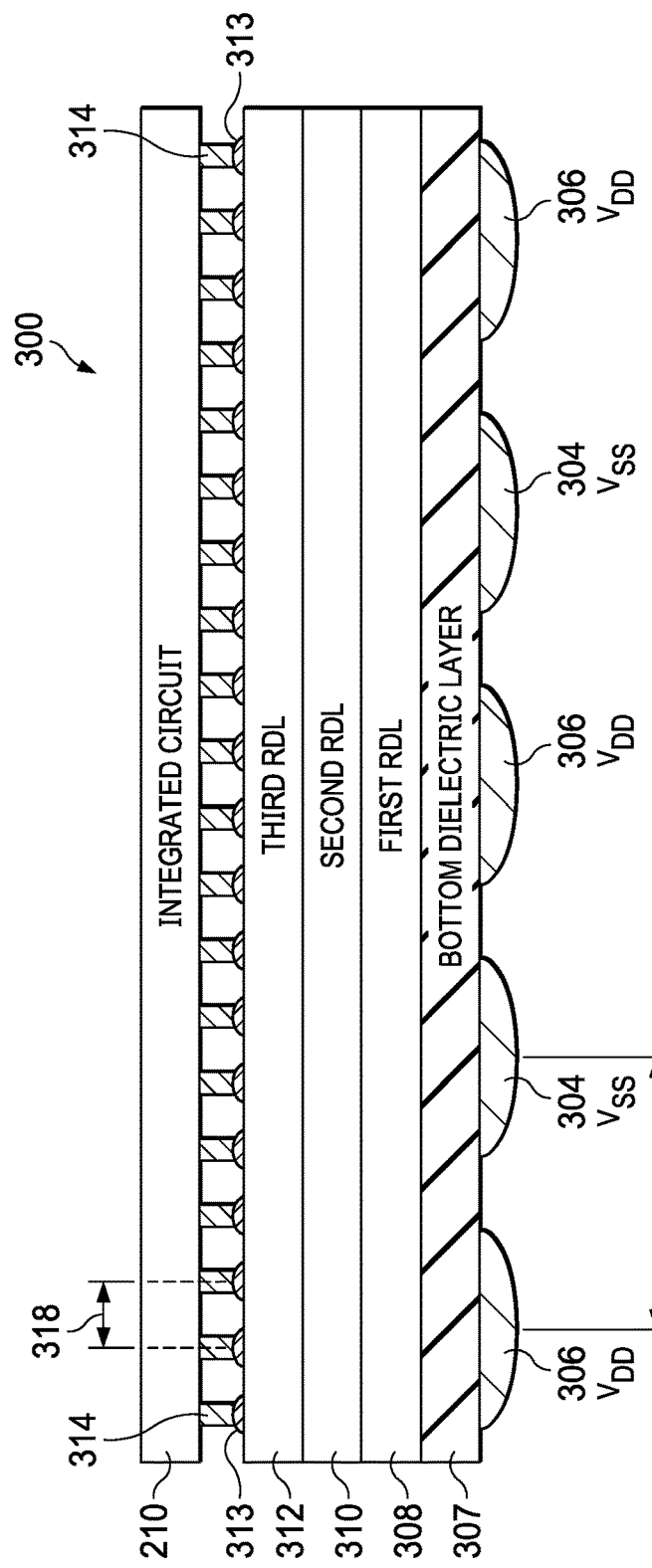
FIG. 3A is a partial sectional side view illustrating a packaged IC according to an embodiment of the present disclosure.

FIG. 3A is a partial sectional side view illustrating a packaged IC according to an embodiment of the present disclosure. The packaged IC 300 includes a bottom dielectric layer 307. Formed on the bottom dielectric layer 307 is a first redistribution layer (RDL) 308 having a first plurality of patterned conductors and a first dielectric layer (detail shown in subsequent FIGs.). Formed on the first RDL 308 is a second RDL 310 having a second plurality of patterned conductors, a second dielectric layer, and a first plurality of vias that extend through the second dielectric layer between the first plurality of patterned conductors and the second plurality of patterned conductors (details also shown in subsequent FIGs.). Formed on the second RDL 310 is a third RDL 312 having a third plurality of patterned conductors, a third dielectric layer, and a second plurality of vias that extend through the third dielectric layer between the second plurality of patterned conductors and the third plurality of patterned conductors (details also shown in subsequent FIGs.). A plurality of package pads 313 extend from the third plurality of patterned conductors through the third dielectric layer. Power package pads and ground package pads of the plurality of package pads 313 have a first lateral separation pitch 318.

An IC 210 includes a plurality of IC pads 314 that couple to the plurality of package pads 313. The packaged IC 300 may include an IC encapsulation (not shown) that encapsulates the IC 210 for protection. The packaged IC 300 also includes a plurality of Printed Circuit Board (PCB) pads that extend through the bottom dielectric layer 307 and contact the first plurality of patterned conductors of the first RDL 308, power PCB pads 304 and ground PCB pads 306 of the plurality of PCB pads have a second lateral separation pitch 316 that exceeds the first lateral separation pitch 318.

In some described embodiments, the first lateral separation pitch 318 may be 40-150 microns (or less). The first lateral separation pitch 318 is a result of the fabrication technique used in the manufacture of the IC package. Instead of using lasers to create via openings in the IC package insulators, lithography and etching are used to create the vias. In such case, the via size ("V") may be 10 microns (or less). Further, lithography, plating, and etching is employed to create the patterned conductors. Using these techniques, the space between patterned conductors ("S1") may be reduced to 5 microns (or less), the via enclosure ("E", portion of patterned conductor that overlays the via) may be reduced to 5 microns (or less), and the spacing between vias of different RDLs ("S2") may be reduced to 5 microns (or less). Resultantly, the IC power pads and IC ground pads may have a lateral separation pitch down to 40 microns (2V+2E+S1+S2). To balance the need of a wide RDL, the power and ground package pad lateral separation pitch (first lateral separation pitch) 318 can be designed from 40 to 150 microns, which would be smaller than current typical internal power lateral separation pitch of 200 um.

Figure 3B:
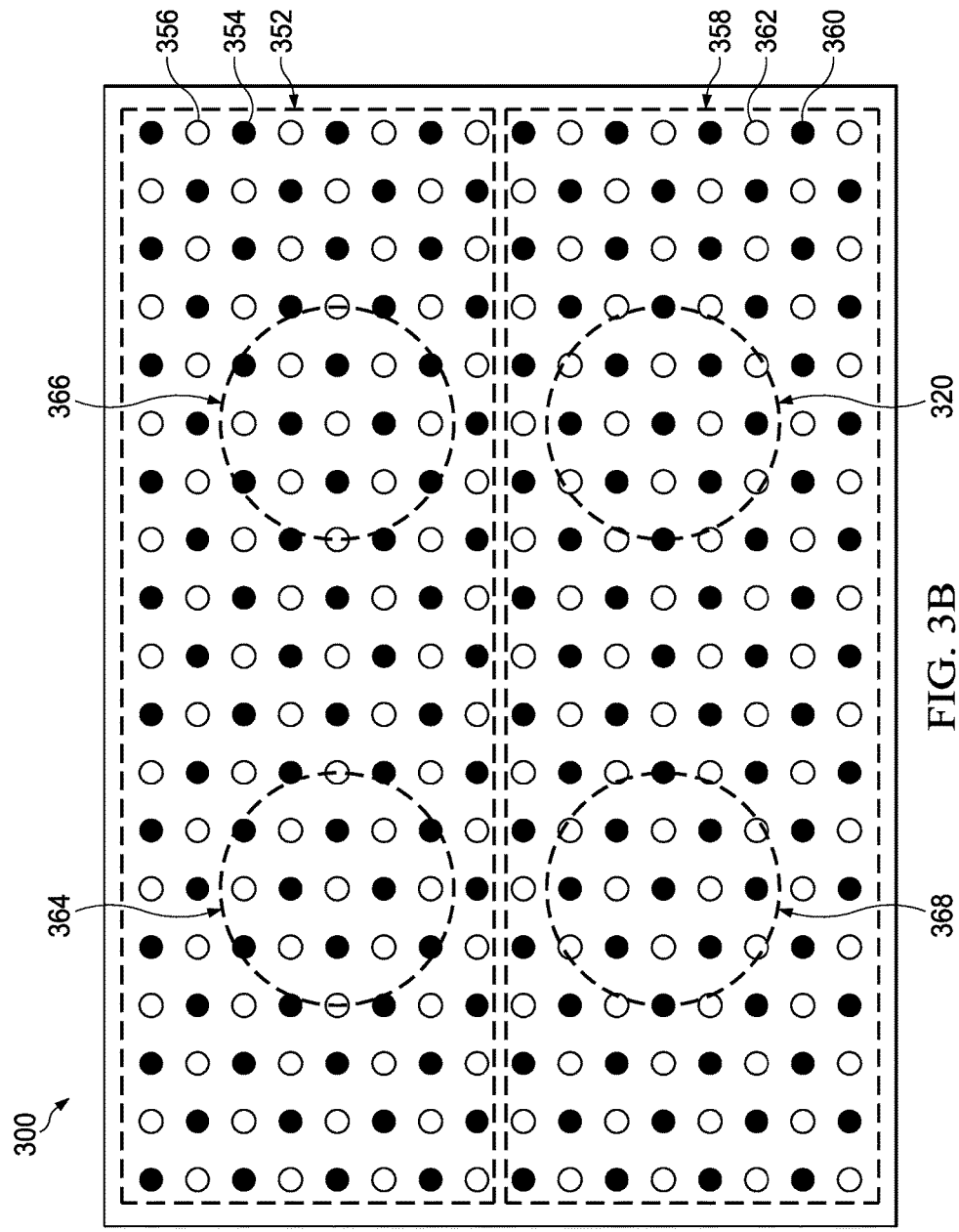
FIG. 3B is a partial transparent diagrammatic top view of the packaged IC of FIG. 3A.

FIG. 3B is a partial transparent diagrammatic top view of the packaged IC of FIG. 3A. FIG. 3B illustrates two areas 352 and 358 of power package pads, ground package pads, and PCB pads. The first area 352 includes power package pads 354, ground package pads 356, a power PCB pad 364 and a ground PCB pad 366. The second area 358 includes power package pads 360, ground package pads 362, power PCB pad 320 and ground PCB pad 368.

According to an aspect of the IC package of embodiments of the present disclosure, power PCB pad 364 electrically couples to a respective plurality of power package pads 354 and ground PCB pad 366 electrically couples to a respective plurality of ground package pads 356. Likewise, power PCB pad 320 electrically couples to a respective plurality of power package pads 360 and ground PCB pad 368 electrically couples to a respective plurality of ground package pads 362. Such is the case because the lateral separation pitch of the PCB pads 364, 366, 368, and 320 is much greater than the lateral separation pitch of the package pads 354, 356, 360, and 362. For example, in one embodiment, the lateral separation pitch of the package pads is 40 microns while the lateral separation pitch of the PCB pads is approximately 400 microns in some embodiments. The interconnection of the PCB pads 364, 366, 368 and 320 and the package pads 354, 356, 360, and 362 may further be determined based upon power domains of an IC coupled thereto.

Referring to both FIGS. 3A and 3B, additional aspects of the disclose embodiment are discussed. According to a first aspect, the first RDL 308 includes a first fanout of power and ground, the second RDL 310 includes a second fanout of power and/or ground that differs from the first fanout of power and/or ground, and the third RDL 312 includes a third fanout of power and ground that differs from one or both the first fanout of power and/or ground and the second fanout of power and/or ground. Such fanouts are determined by the routing of vias between RDLs and the patterning of conductors of the RDLs. Such fanout decisions may be based upon the logic serviced by various portions of the IC, the density of transistors in various locations of the IC, the power consumption characteristics of various portions of the IC, or other considerations.

According to another aspect, the first RDL 308 includes a first fanout of power and a first fanout of ground, the second RDL 310 includes second fanout of power that differs from the first fanout of power, and the third RDL 312 includes second fanout of ground that differs from the first fanout of ground.

FIG. 4A is partial sectional side view illustrating aspects of a packaged IC according to an embodiment of the present disclosure. FIG. 4B is a partial sectional side view illustrating aspects of a differing packaged IC according to an embodiment of the present disclosure. As was briefly described in the background herein, packaged ICs are subject to mounting stress, which can compromise IC pads, connections between the IC pads and the package pads of the IC package, and the structure of the IC itself (low K films). Thus, it is desirable to reduce stress of the IC. However, with package pads with reduced lateral separation pitch, mounting stress may be increased, particularly if copper is used for the package pads and vias.

Thus, referring to FIG. 4A, the packaged IC 400 includes an aspect of embodiments of the present disclosure that reduces mounting stress of the IC 404. The dashed area 402 of FIG. 4A refers to components of the packaged IC that illustrate this aspect. Particularly, according to this aspect, the first plurality of vias of the first RDL are offset from the second plurality of vias of the second RDL to minimize mounting stress on the IC. Further, the third plurality of vias of the third RDL may be offset from the second plurality of vias of the second RDL to further minimize mounting stress on the IC 404. By having the vias of the RDLs offset from one another, mounting stress on the IC is reduced.

Referring now to FIG. 4B, a different IC package 410 configuration is shown. Generally, referring to dashed area 412, the IC package 410 includes RDLs with vias that are substantially stacked with respect to each other. Such stacking increases mounting stress on the IC 414, which can cause the connections between the IC pads of the IC 414 and the package pads of the IC package to fail or may otherwise damage the IC.

Figure 5:
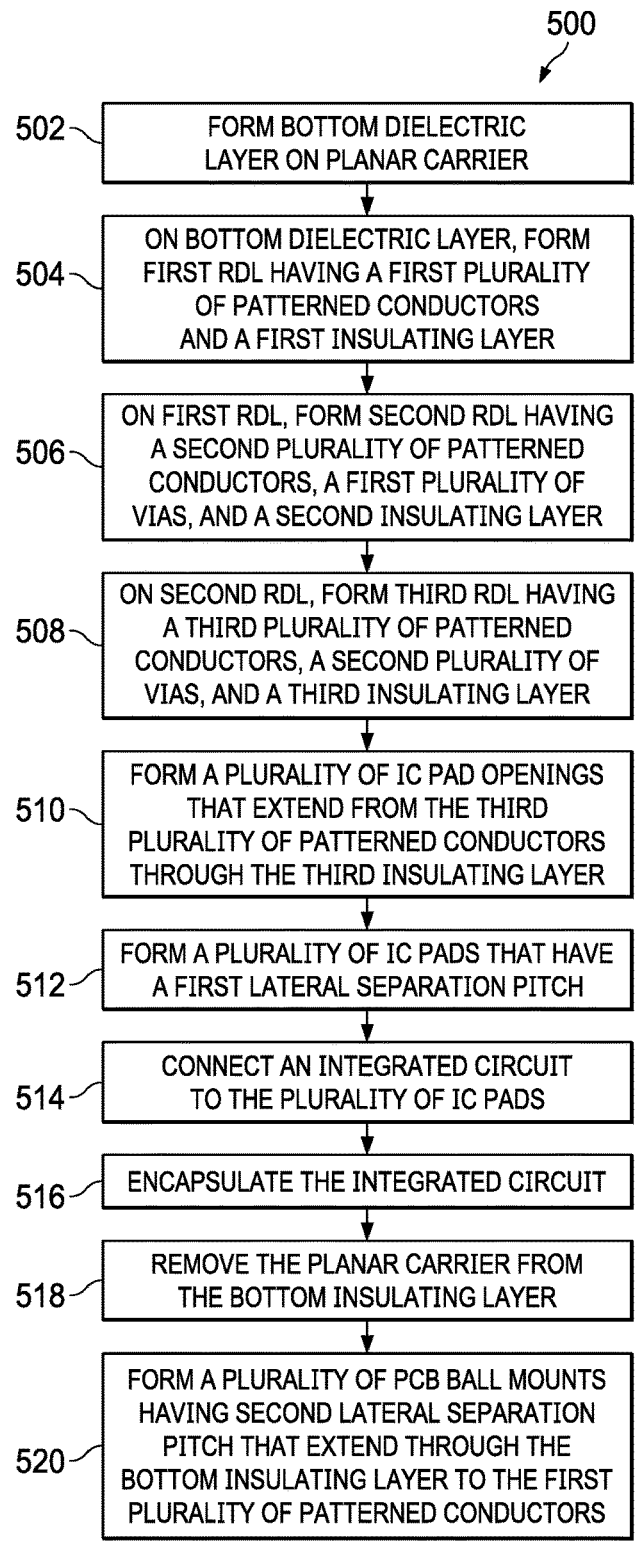
FIG. 5 is a flow chart illustrating operations for constructing a packaged IC according to an embodiment of the present disclosure.

FIG. 5 is a flow chart illustrating operations for constructing a packaged IC according to an embodiment of the present disclosure. The operations 500 of FIG. 5 begin with forming a bottom dielectric layer on a planar carrier (step 502). These operations will be further described with reference to FIGS. 6A-6O. The planar carrier may be glass or another dielectric material. The operations 500 continue with forming a first RDL on the bottom dielectric layer (step 504). The first RDL has a first plurality of patterned conductors and a first dielectric layer. A second RDL is then formed on the first RDL (step 506). The second RDL has a second plurality of patterned conductors, a second dielectric layer, and a first plurality of vias that extend through the second dielectric layer between the first plurality of patterned conductors and the second plurality of patterned conductors. A third RDL is then formed on the second RDL (step 508). The third RDL has a third plurality of patterned conductors, a third dielectric layer, and a second plurality of vias that extend through the third dielectric layer between the second plurality of patterned conductors and the third plurality of patterned conductors.

Operations 500 continue with forming a plurality of package pad openings that extend from the third plurality of patterned conductors through the third dielectric layer (step 510). Next, a plurality of package pads is formed that extend into the plurality of package pad openings (step 512). Power package pads and ground package pads of the plurality of package pads have a first lateral separation pitch as was previously described and as will be further illustrated. The package pads may include solder bumps. Operations then include electrically connecting an IC to the plurality of package pads (step 514). The electrical connections are made by bonding a plurality of IC pads of the IC to the package pads.

Operations 500 then include encapsulating the IC with a protective encapsulant (step 516). Encapsulation protects the IC and the connections between the IC pads and the package pads. Next, operations include removing the planar carrier from the bottom dielectric layer (step 518). Operations 500 conclude with forming a plurality of PCB pads that extend through the bottom dielectric layer and contact the first plurality of patterned conductors (step 520). The power PCB pads and ground PCB pads of the plurality of PCB pads have a second lateral separation pitch that exceeds the first lateral separation pitch.

Operations 500 may include various aspects. With one aspect, in forming the packaged IC, at least one of the power PCB pads electrically couples to a respective plurality of power package pads and at least one of the ground PCB pads electrically couples to a respective plurality of ground package pads. According to another aspect, the first RDL includes a first fanout of power and ground, the second RDL includes a second fanout of power and ground that differs from the first fanout of power and ground, and the third RDL includes a third fanout of power and ground that differs from both the first fanout of power and ground and the second fanout of power and ground.

According to still another aspect, the first RDL includes a first fanout of power and a first fanout of ground, the second RDL includes second fanout of ground that differs from the first fanout of ground, and the third RDL includes second fanout of power that differs from the first fanout of power. Moreover, according to yet another aspect, the first plurality of vias are offset from the second plurality of vias to minimize mounting stress on the IC as was illustrated in FIG. 4A.

Figure 6A:
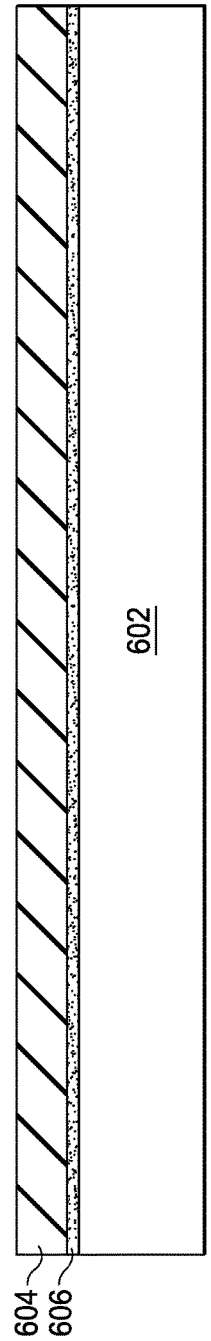
FIGS. 6A through 6O are partial sectional views illustrating the construction of a packaged IC consistent with the operations of FIG. 5.
Figure 6B:
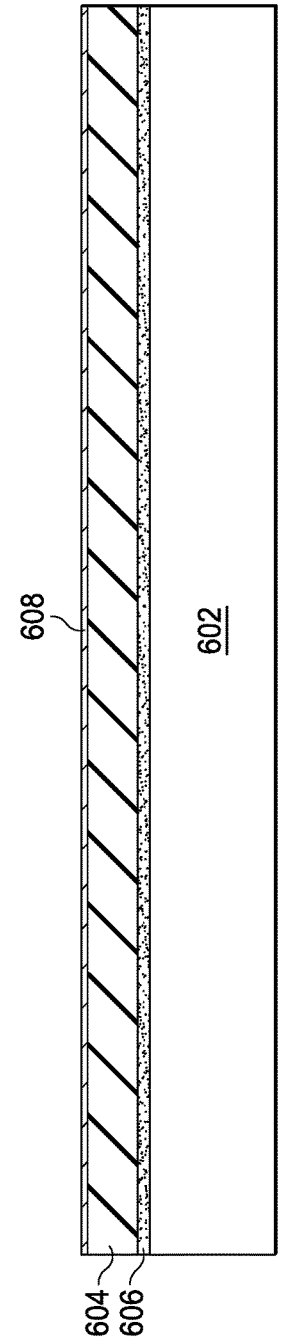
Figure 6C:
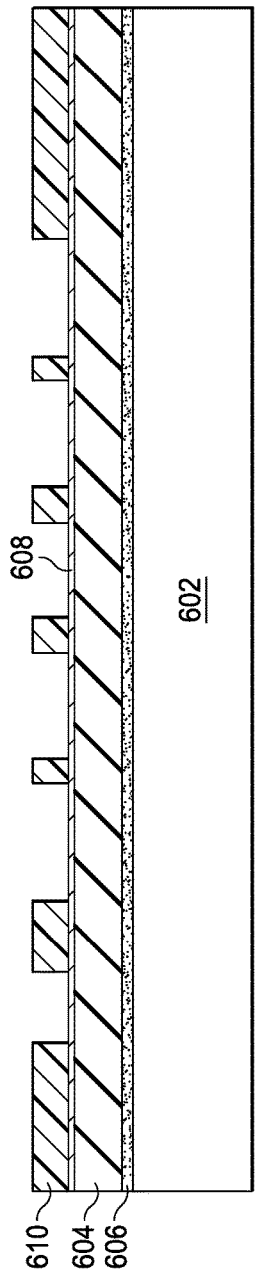
Figure 6D:
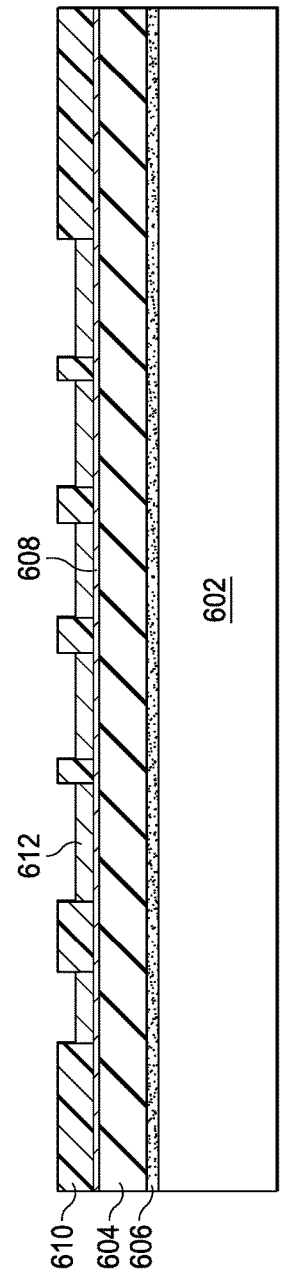
Figure 6I:
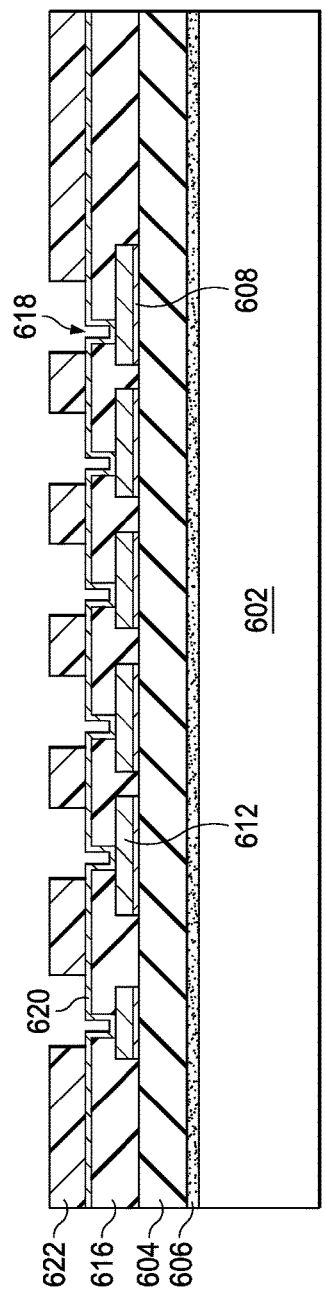
Figure 6J:
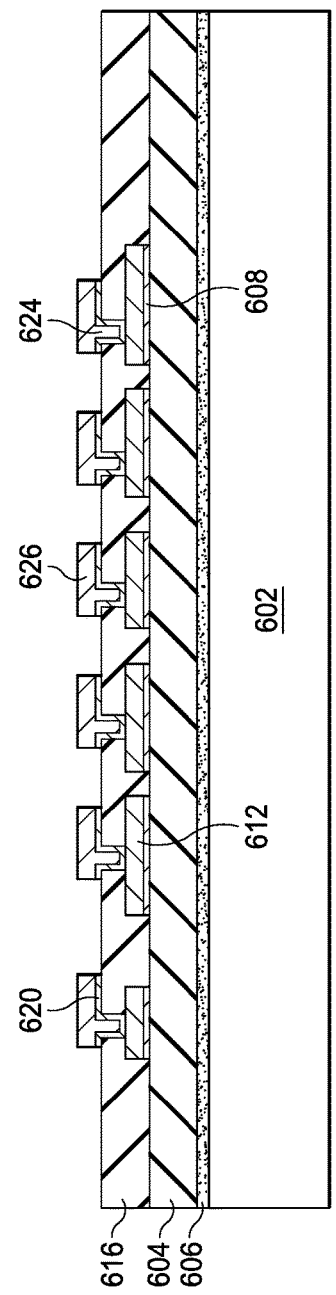
Figure 6M:
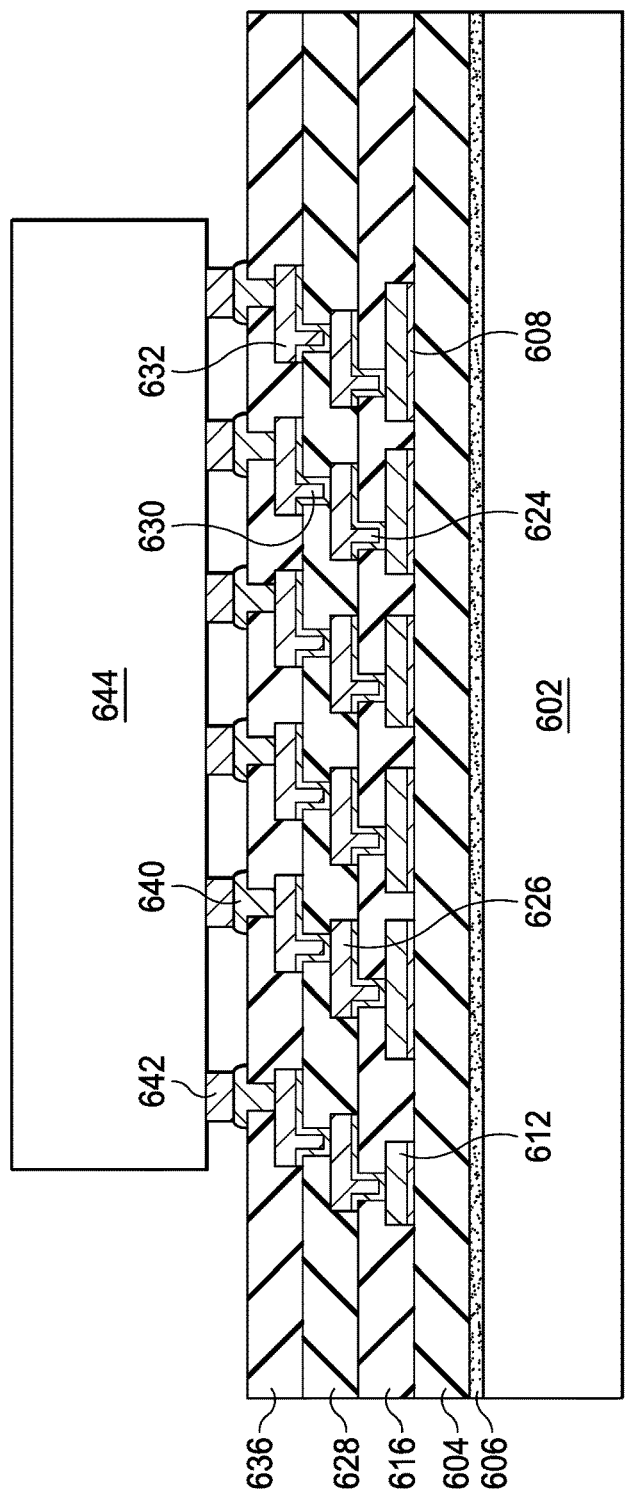
Figure 6N:
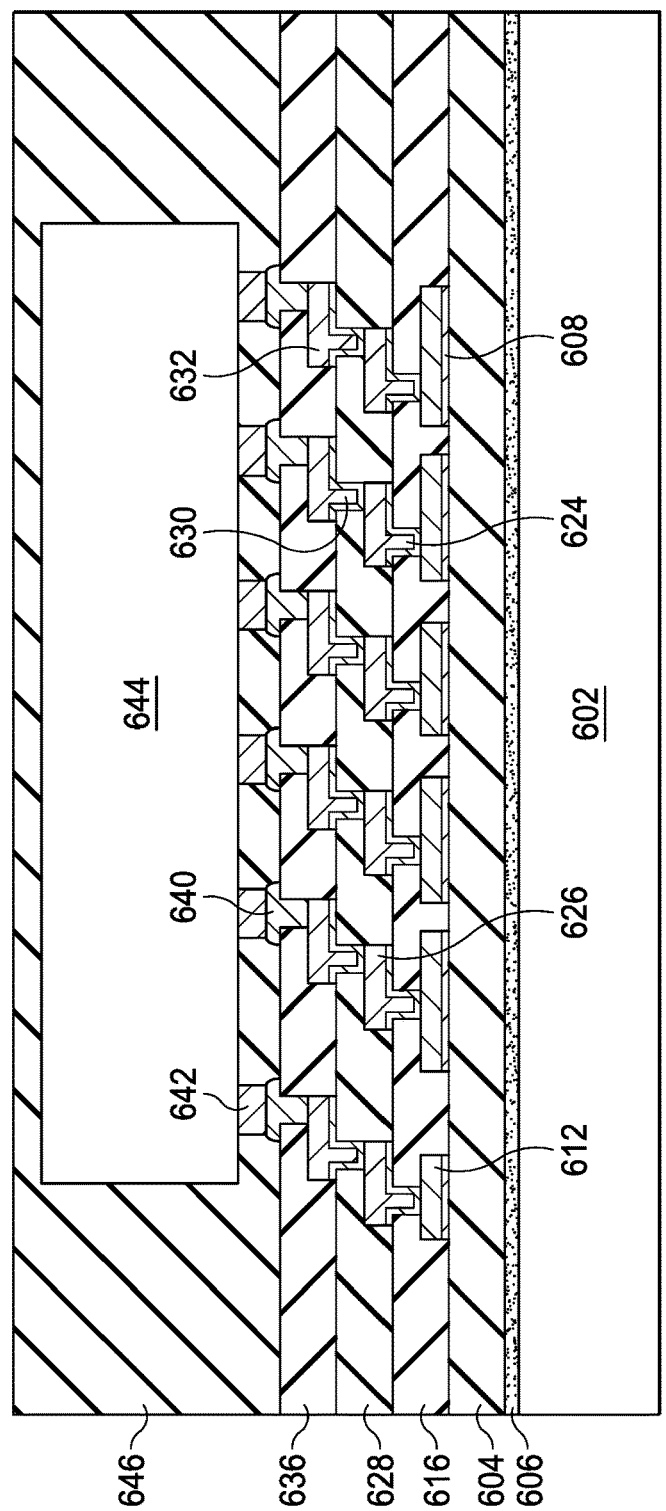
Figure 6O:
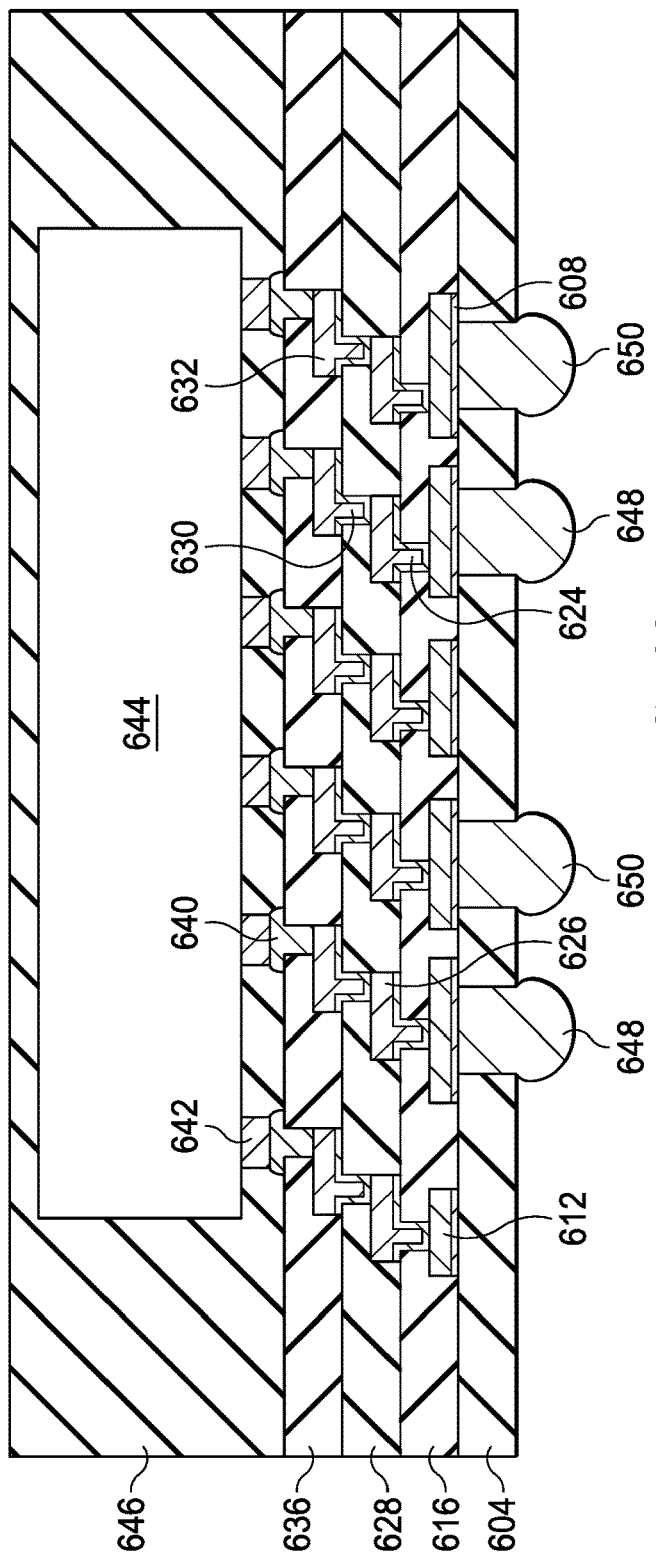

FIGS. 6A through 6O are partial sectional views illustrating the construction of a packaged IC consistent with the operations of FIG. 5. Referring to FIG. 6A, a bottom dielectric layer 604 is formed on a planar carrier 602. The bottom dielectric layer 604 may be adhered to the planar carrier 602 with adhesive 606.

Referring now to FIG. 6B, a first step in forming the first RDL is to deposit a first metal seed layer 608 on the bottom dielectric layer 604. Next, referring to FIG. 6C, a first patterned resist layer 610 is formed on the first metal seed layer 608. The first patterned resist layer 610 may be applied as a coat and then be lithography patterned with a stepper. In such case, the first patterned resist layer 610 is a photo resist layer. Then, referring to FIG. 6D, the photo resist layer 610 and exposed portions of the first metal seed layer 608 are electrically plated to a depth that will correspond to the first plurality of patterned conductors 612 (thicker in some cases to allow for subsequent etching). Next, referring to FIG. 6E, the first patterned resist layer and underlying portions of the first metal seed layer are removed to expose the first plurality of patterned conductors 612 and to expose a portion of the bottom dielectric layer 604. Then, referring to FIG. 6F, the first dielectric layer 616 is deposited on the first plurality of patterned conductors 612 and an exposed portion of the bottom dielectric layer 604. The first dielectric layer 616 may be a coat of polyimide or polybenzoxazole (PBO) based dielectric material.

Referring now to FIG. 6G, forming the second RDL on the first RDL includes forming a first plurality of via openings 618 in the first dielectric layer 616 that extend to the first plurality of patterned conductors 612. Referring now to FIG. 6H, a second metal seed layer 620 is then deposited on exposed portions of the first dielectric layer 616, including the via openings 618. The second metal seed layer 620 may be deposited in a Physical Vapor Deposition (PVD) process. Next, referring to FIG. 6I, a second patterned resist layer 622 is formed on the second metal seed layer 620. Then, the second patterned resist layer 622 is electro plated. Referring to FIG. 6J, after removal of the second patterned resist layer 622 the first plurality of vias 624 and the second plurality of patterned conductors 626 are formed. Removal of the second patterned resist layer 622 also exposes a portion of the first dielectric layer 616.

Referring now to FIG. 6K, forming the third RDL on the second RDL includes depositing a second dielectric layer 628 on the second plurality of patterned conductors 626 and an exposed portion of the first dielectric layer 616. Then, a second plurality of via openings are formed in the second dielectric layer 628 that extend to the second plurality of patterned conductors 626. Then, a third metal seed layer is deposited on the second dielectric layer 628 and a third patterned resist layer is formed on the third metal seed layer. Then, the third patterned resist layer and uncovered portions are electroplated. Next the third patterned resist layer is removed to form the second plurality of vias 630 and the third plurality of patterned conductors 632.

Referring now to FIG. 6L, a third dielectric layer 636 is deposited on the third plurality of patterned conductors 632 and an exposed portion of the second dielectric layer 628. Litho patterning and etching are used to form a plurality of package pad openings 638 that extend from the third plurality of patterned conductors 632 through the third dielectric layer 636. Note that in FIGS. 6K and 6L, the space between patterned conductors 632 ("S1") may be reduced to 5 microns (or less), the via enclosure ("E", portion of a patterned conductor 632 that overlays a via 630 may be reduced to 5 microns (or less), and the spacing between vias of different RDLs ("S2") may be reduced to 5 microns (or less). The upper and lower via size could be down to 10 microns. Then the minimum first lateral separation pitch could be S1+S2+2V+2E=40 microns, which can be coupled to the IC pads for internal power and internal ground. Referring to FIG. 6M, a plurality of package pads 640 are formed that extend into the plurality of package pad openings 638. Power package pads and ground package pads of the plurality of package pads 640 have a first lateral separation pitch as was previously described and as will be further illustrated. The package pads 640 may include solder bumps. Operations then include electrically connecting an IC 644 to the plurality of package pads 640. The electrical connections are made by bonding, e.g., soldering, a plurality of IC pads 642 of the IC 644 to the package pads 640.

Referring now to FIG. 6N, the IC 644 is encapsulated with a protective encapsulant 646. Encapsulation protects the IC and the connections between the IC pads 642 and the package pads 640. Referring now to FIG. 6O, the planar carrier is removed from the bottom dielectric layer 604 and a plurality of PCB pads 648 and 650 are formed that extend through the bottom dielectric layer 604 and contact the first plurality of patterned conductors 612. The power PCB pads 648 and the ground PCB pads 650 of the plurality of PCB pads have a second lateral separation pitch that exceeds the first lateral separation pitch. The PCB pads 648 and 650 may include solder balls that are used to mount the packaged IC onto a PCB.

Figure 7:
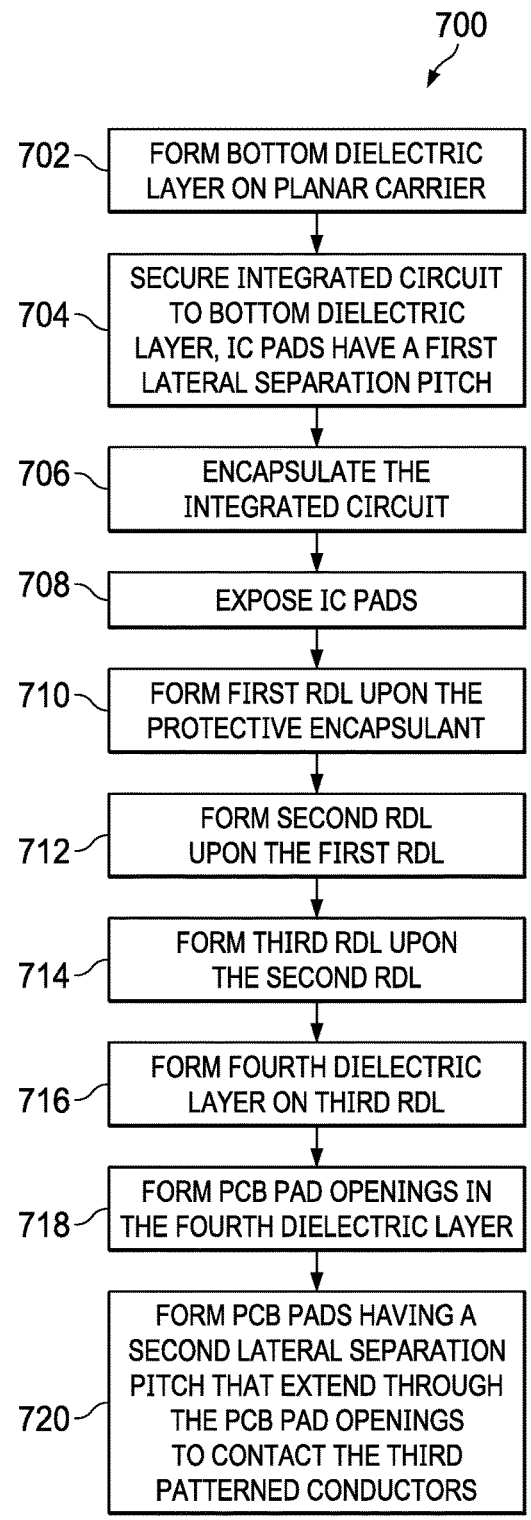
FIG. 7 is a flow chart illustrating operations for constructing a packaged IC according to a differing embodiment of the present disclosure.

FIG. 7 is a flow chart illustrating operations for constructing a packaged IC according to a differing embodiment of the present disclosure. The operations 700 of FIG. 7, which will be described further with reference to FIGS. 8A-8H, begin with forming a bottom dielectric layer on a planar carrier (step 702). Then, an IC is secured to the bottom dielectric layer, the IC having a plurality of IC pads opposite the bottom dielectric layer, the plurality of IC pads having a first lateral separation pitch (step 704). The IC is encapsulated with a protective encapsulant (step 706) and the plurality of IC pads is exposed (step 708). Exposing the plurality of IC pads may be done via etching of the protective encapsulant.

Next, operations 700 include forming a first RDL on the protective encapsulant, the first RDL having a first dielectric layer formed on the protective encapsulant, a first plurality of patterned conductors formed on the first dielectric layer, and a first plurality of vias that extend through the first dielectric layer from the first plurality of patterned conductors to the plurality of IC pads (step 710). Operations 700 next include forming a second RDL on the first RDL, the second RDL having a second dielectric layer formed on the first RDL, a second plurality of patterned conductors formed on the second dielectric layer, and a second plurality of vias that extend from the second plurality of patterned conductors to the first plurality of patterned conductors through the second dielectric layer (step 712).

Operations 700 then include forming a third RDL on the second RDL, the third RDL having a third dielectric layer formed on the second RDL, a third plurality of patterned conductors formed on the third dielectric layer, and a third plurality of vias that extend from the third plurality of patterned conductors to the second plurality of patterned conductors through the third dielectric layer (step 714). A fourth dielectric layer is then formed on the third RDL (step 716). Next, operations 700 include forming a plurality of PCB package pad openings that extend through the fourth dielectric layer to the third plurality of patterned conductors (step 718). Operations 700 conclude with forming a plurality of PCB pads that extend through the plurality of PCB package pad openings to the third plurality of patterned conductors, power PCB pads and ground PCB pads of the plurality of PCB pads having a second lateral separation pitch that exceeds the first lateral separation pitch (step 720). With the operations of step 720 completed, the packaged IC is complete. However, operations 700 may include removing the planar carrier from the bottom dielectric layer.

Figure 8A:
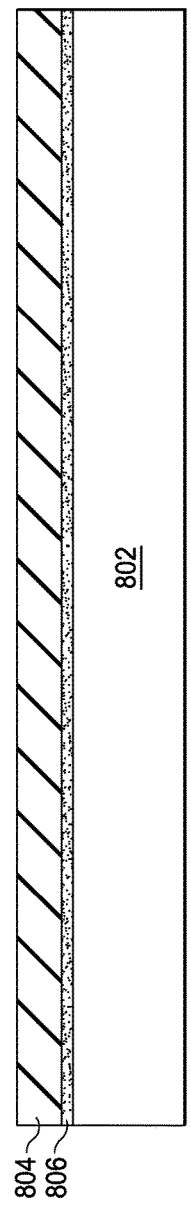
FIGS. 8A through 8H are partial sectional view illustrating the construction of a packaged IC consistent with the operations of FIG. 7.
Figure 8B:
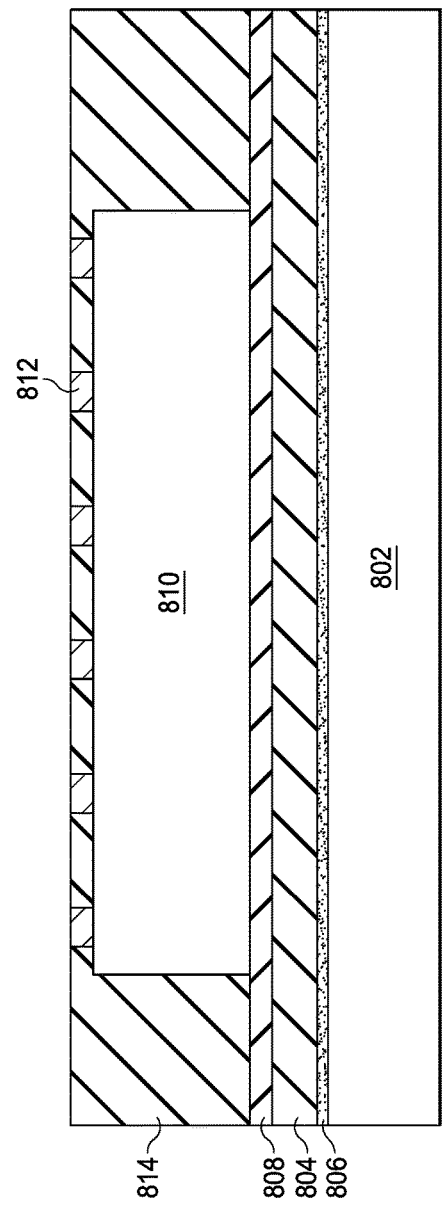

FIGS. 8A through 8H are partial sectional view illustrating the construction of a packaged IC consistent with the operations of FIG. 7. Referring to FIG. 8A, operations 700 include forming a bottom dielectric layer 804 on a planar carrier 802, e.g., by using an adhesive 806 between the planar carrier 802 and the bottom dielectric layer 804 or by using another technique. Referring to FIG. 8B, the IC 810 is secured to the bottom dielectric layer 804 using an adhesive 806, for example. The IC has a plurality of IC pads 812 opposite the bottom dielectric layer 808, the plurality of IC pads 812 having a first lateral separation pitch. The IC 810 is then encapsulated with a protective encapsulant 814. Then, the plurality of IC pads 812 is exposed. Exposing the plurality of IC pads 812 may be done via etching of the protective encapsulant 814 or by applying the protective encapsulant 814 only to the depth of the IC pads 812.

Figure 8C:
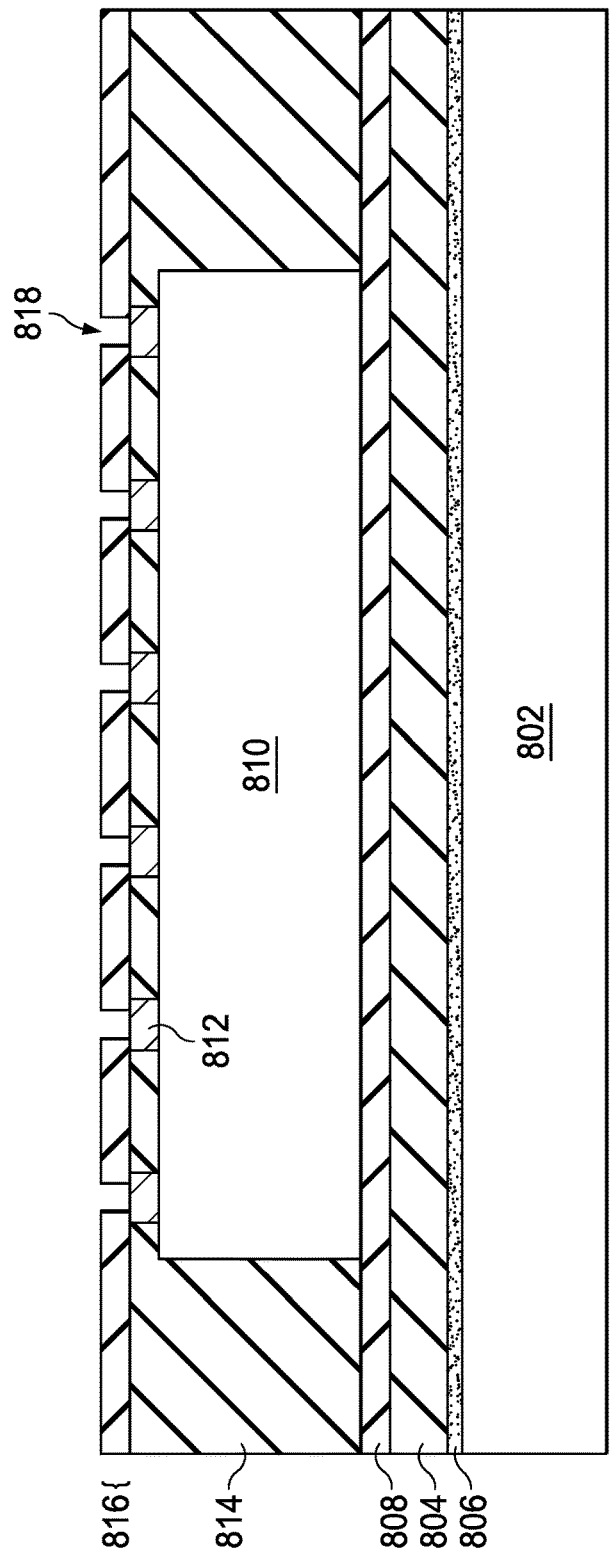
Figure 8D:
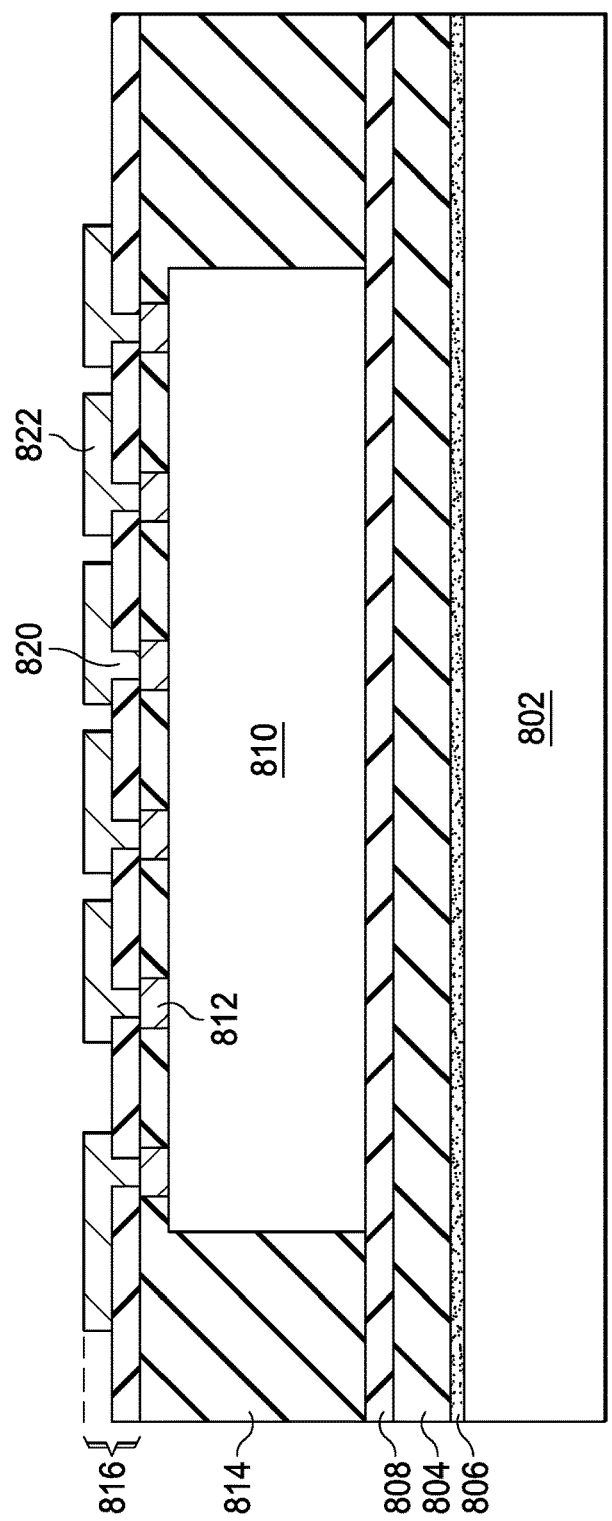
Figure 8E:
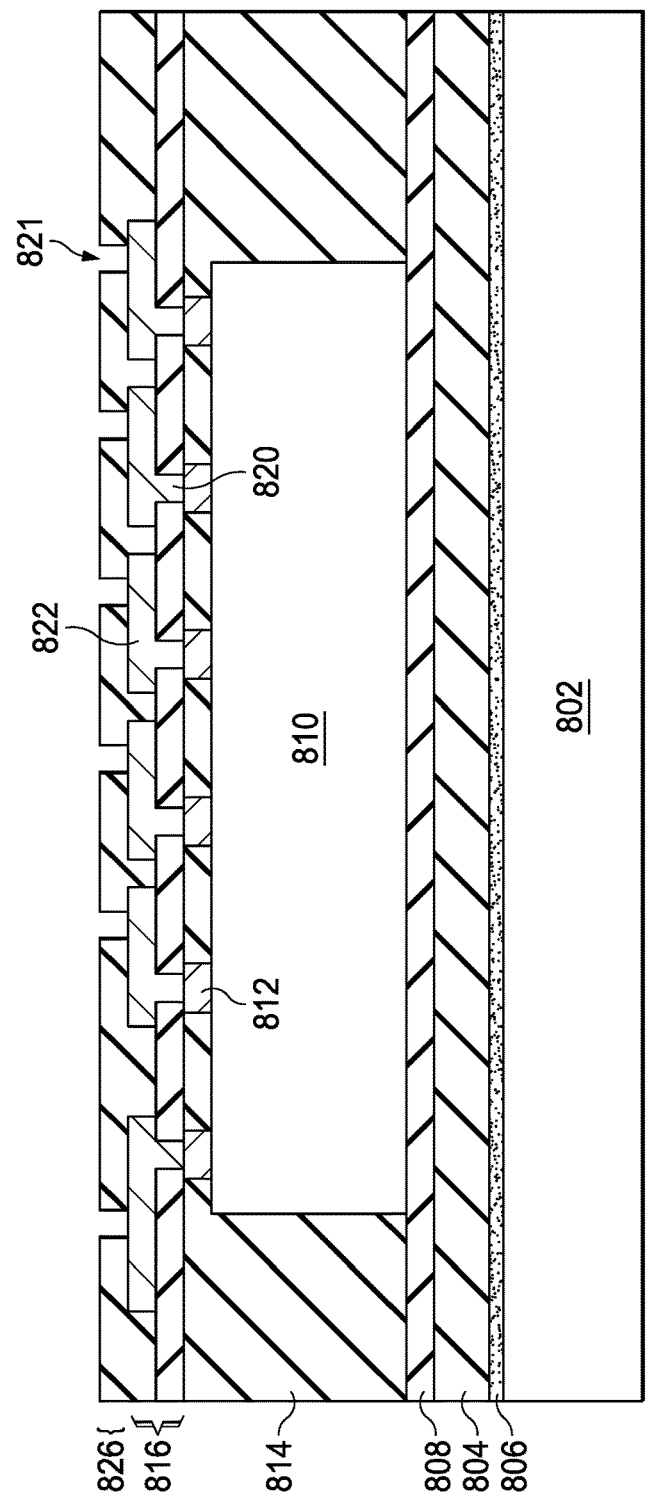

Next, referring to FIG. 8C, formation of the first RDL on the protective encapsulant 814 begins by first depositing a first portion of a first dielectric layer 816 on the protective encapsulant 814 and forming a first plurality of via openings 818 in the first portion of the first dielectric layer 816 that extend to the plurality of IC pads 812, e.g., by applying a resist layer, patterning the resist layer, etching the patterned resist layer to form the via openings, and then stripping the photo resist. Referring now to FIG. 8D, forming the first plurality of patterned conductors 822 and the first plurality of vias 820 includes, for example, depositing a first metal seed layer on the first portion of the first dielectric layer 816, forming a first patterned resist layer on the first metal seed layer, electrical plating the first patterned resist layer, removing the first patterned resist layer and underlying portions of the first metal seed layer to form the first plurality of patterned conductors and the first plurality of vias and to expose a portion of the first portion of the first dielectric layer 816. Referring now to FIG. 8E, manufacture continues with depositing a second portion of the first dielectric layer 816 on the first plurality of patterned conductors 822 and exposed portions of the first portion of the first dielectric layer 816, depositing a first portion of a second dielectric layer 826, and forming via openings 823 corresponding to the second plurality of vias using a patterned resist layer and etching. Note that the second portion of the first dielectric layer 816 and the first portion of the second dielectric layer 826 may be formed in a common process step. The via openings 823 extend through the first portion of the second dielectric layer 826 to the first plurality of patterned conductors 822. The patterned resist layer is removed after formation of the via openings 823. Like the structures of FIGS. 6K and 6L, the minimum lateral separation pitch available for power and ground pads is determined by top and bottom via size (V), RDL via enclosure (E), the space between vias of differing RDLs (S2), and the space between RDL patterned conductors (S1). The minimum lateral separation pitch for power and ground package pads, therefore, could be 2V+2E+S1+S2, which for the described embodiments is between 40 microns and 150 microns. Of course, in embodiments this dimension could be larger or smaller.

Figure 8F:
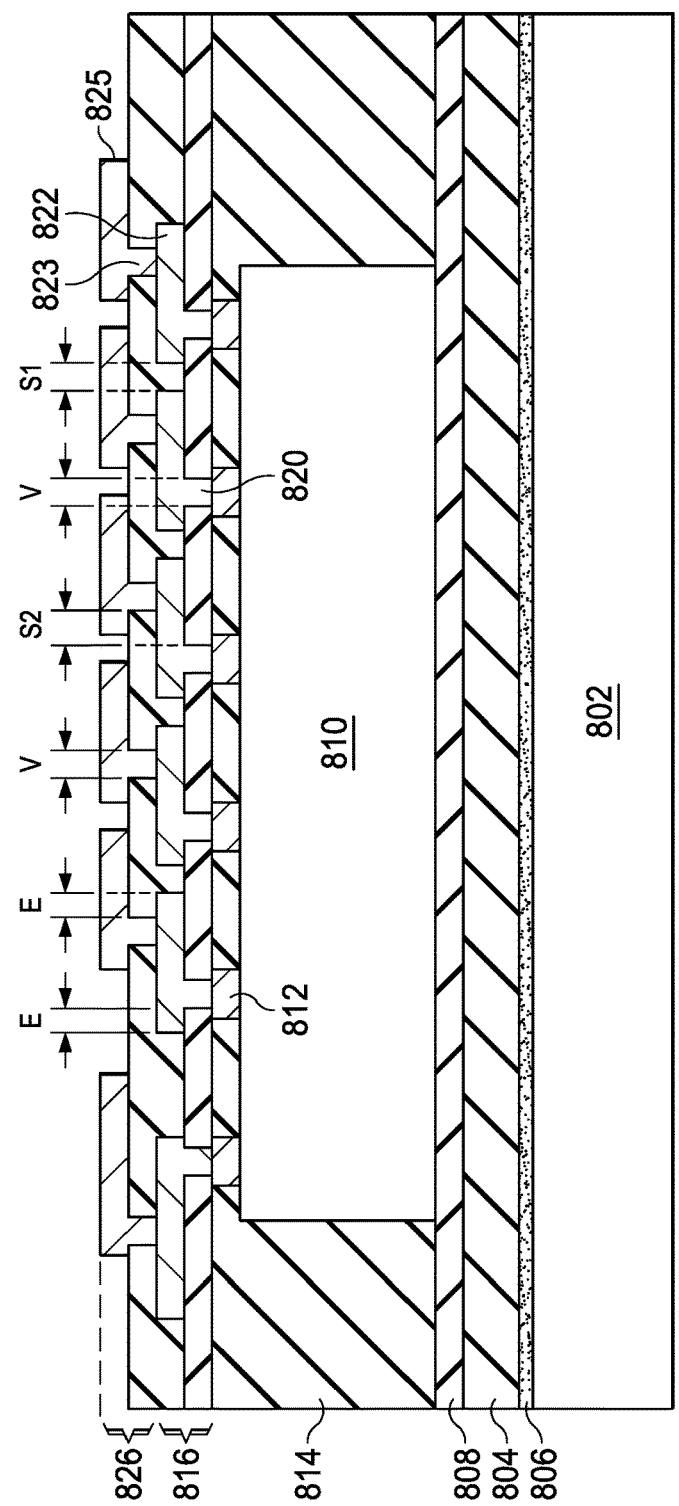

Referring now to FIG. 8F, the first RDL and a portion of the second RDL are shown. Forming a second plurality of vias 823 and a second plurality of patterned conductors 825 includes depositing a second metal seed layer on the first portion of the second dielectric layer 826, forming a second patterned resist layer on the second metal seed layer, electrical plating the second patterned resist layer to form the second plurality of vias 823 and the second plurality of patterned conductors 825, removing the second patterned resist layer and underlying portions of the second metal seed layer to expose some of the first portion of the second dielectric layer 826, and then depositing a second portion of the second dielectric layer 826 (second portion of second dielectric layer 826 not shown in FIG. 8F).

Figure 8G:
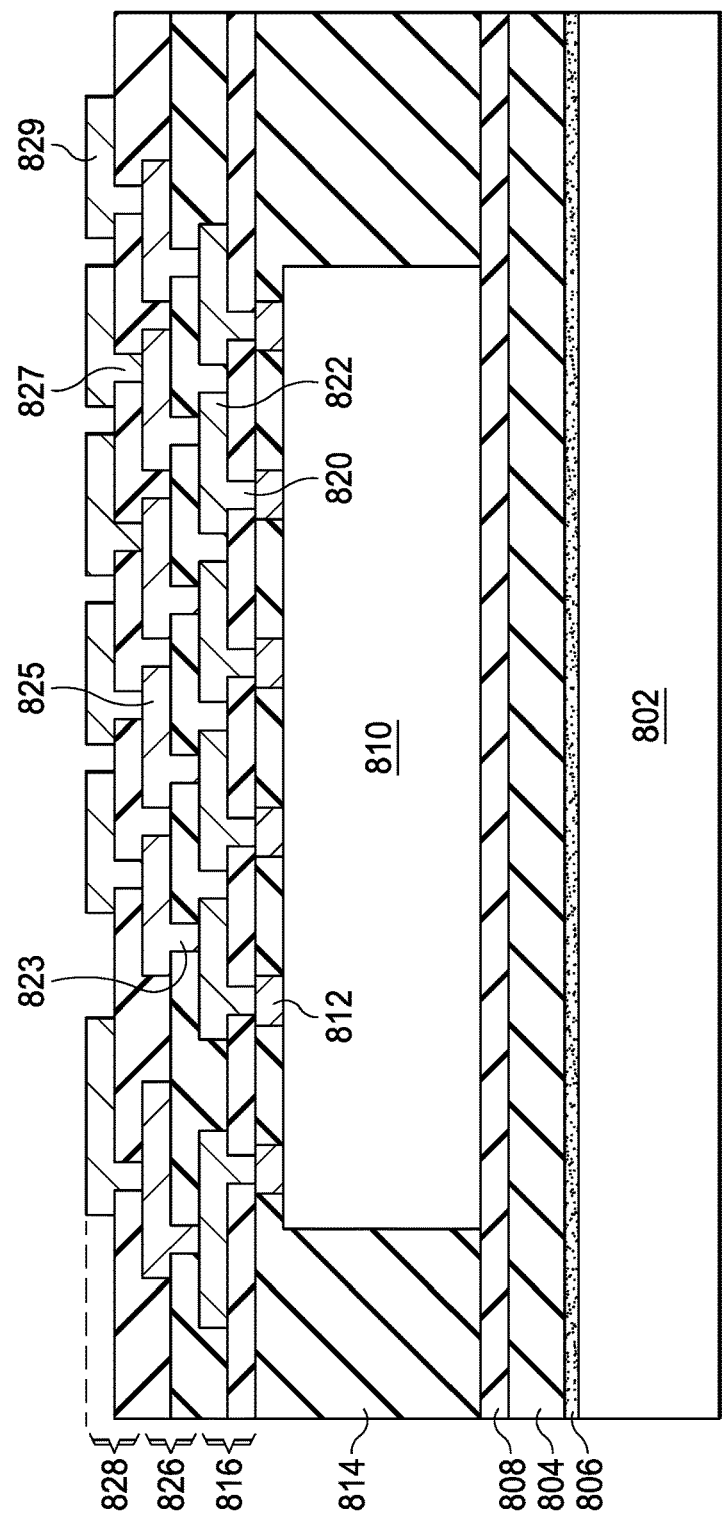

Referring to FIG. 8G, the second RDL is shown to be fulling formed and the third RDL is shown to be mostly formed. The third RDL is formed on the second RDL by depositing a first portion of a third dielectric layer 828 on the second RDL (note that the second portion of the second dielectric layer 826 and the first portion of the third dielectric layer 828 may be formed in a common process step. Next, operations continue with forming a third plurality of via openings in the first portion of the third dielectric layer 828 that extend to the second plurality of patterned conductors 825, depositing a third metal seed layer on the first portion of the third dielectric layer 828, forming a third patterned resist layer on the third metal seed layer, electrical plating the third patterned resist layer, removing the third patterned resist layer and underlying portions of the third metal seed layer to create the third plurality of vias 827, the third plurality of patterned conductors 829 and to expose some of the first portion of the third dielectric layer 828. Operation then includes depositing a second portion of the third dielectric layer 828 on the third plurality of patterned conductors and an exposed portion of the first portion of the third dielectric layer 828 (now shown in FIG. 8G).

Figure 8H:
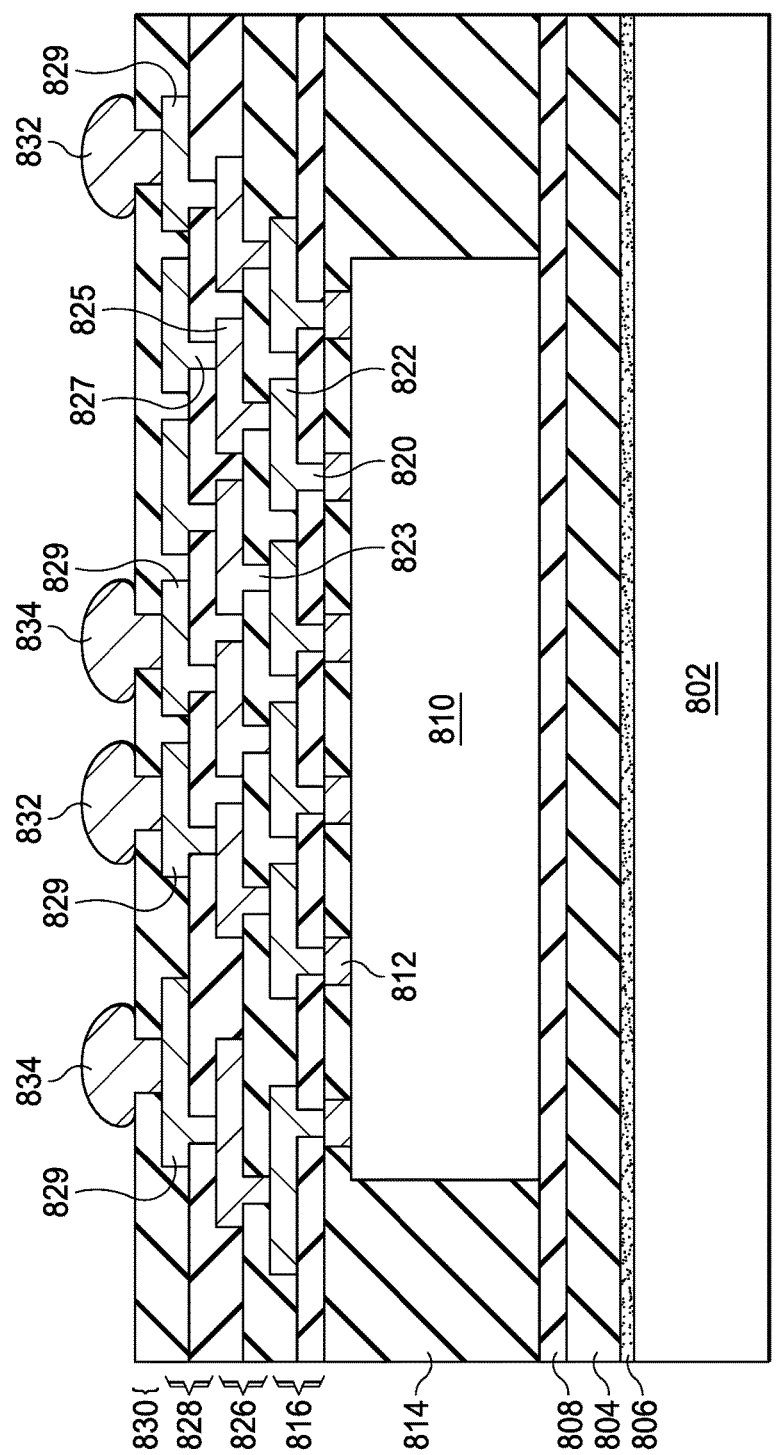

Referring now to FIG. 8H, the first, second, and third RDLs are shown to be fully formed. A fourth dielectric layer 830 is then formed on the third RDL. Note, that the second portion of the third dielectric layer 828 and the fourth dielectric layer 830 may be formed in a common process step. Next, operations include forming a plurality of PCB pad openings that extend through the fourth dielectric layer 830 to the third plurality of patterned conductors 829. Operations conclude with forming a plurality of PCB pads 832 and 834 that extend through the plurality of PCB pad openings to the third plurality of patterned conductors. Power PCB pads 832 and ground PCB pads 834 of the plurality of PCB pads have a second lateral separation pitch that exceeds the first lateral separation pitch. The manufacturing process may further include removing the planar carrier 802 (and adhesive 806) from the bottom dielectric layer 804.

Note that the previously described FIGs. consider first, second, and third RDLs. In differing embodiments, fewer than three or more than three RDLs may be included. Such greater number of RDLs may be required in some embodiments to service a larger disparity between the first lateral separation pitch and the second lateral.

Figure 9A:
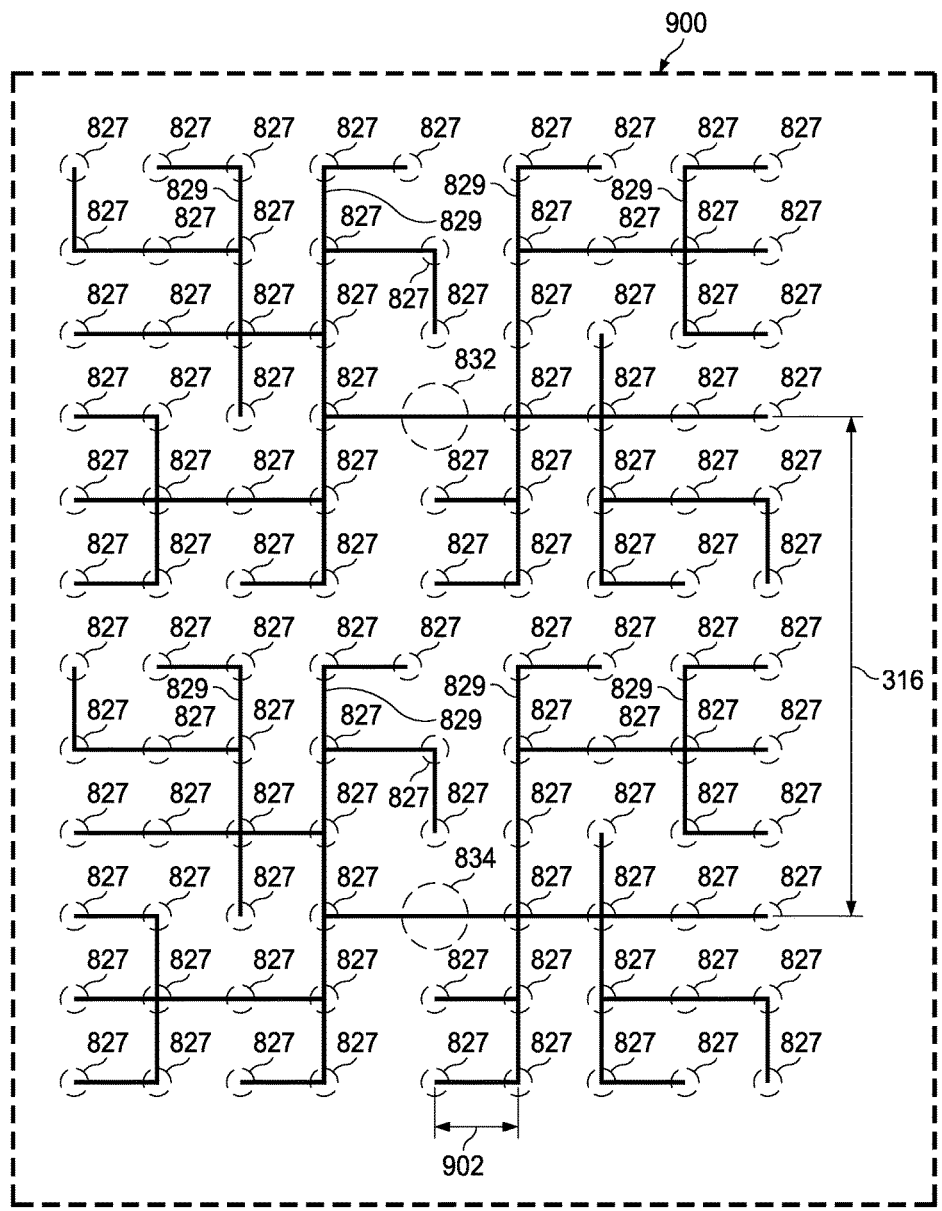
FIG. 9A is a diagram illustrating one fanout of power and ground consistent with one or more disclosed embodiments.
Figure 9B:
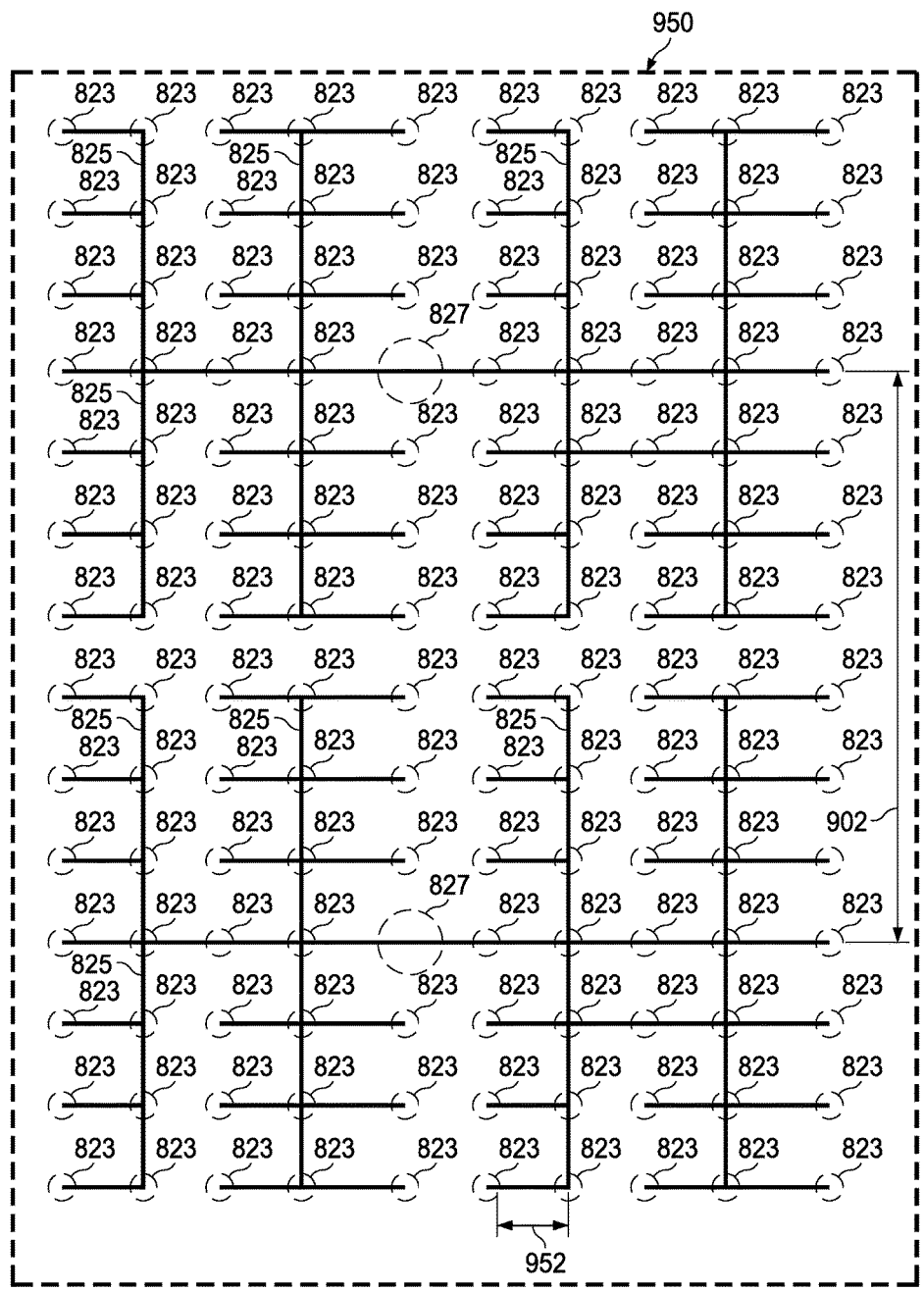
FIG. 9B is a diagram illustrating another fanout of power and ground consistent with one or more disclosed embodiments.

FIG. 9A is a diagram illustrating one fanout of power and ground consistent with one or more disclosed embodiments. FIG. 9B is a diagram illustrating another fanout of power and ground consistent with one or more disclosed embodiments. Reference numerals used in FIGS. 9A and 9B are consistent with FIGS. 8A-8H. While FIG. 9A refers directly to the third RDL and FIG. 9B refers directly to the second RDL, the reader will appreciate that the principles conveyed in these FIGs. are easily extensible to other RDLs and/or to embodiments having fewer than three RDLs or more than three RDLs.

FIG. 9A illustrates a third fanout 900 of power and ground corresponding to the third RDL. Illustrated particularly in FIG. 9A are PCB pads 832 and 834 (transparent view), the third plurality of conductors 829, and the third plurality of vias 827 (transparent view). As was previously described with reference to FIG. 8H, the plurality of PCB pads 832 and 834 extend through the plurality of PCB pad openings to the third plurality of conductors 829 and the third plurality of vias 827 couple the third plurality of conductors 829 to the second plurality of conductors 825.

Fanouts, as described herein, are RDL patterned conductor structures that distribute power and/or ground within a single RDL. Thus, fanouts are determined by the routing of patterned conductors of the RDL (as designed). With the fanout 900 of FIG. 9, the patterned conductors are formed to correspond to the vertical connections they support, i.e., vias, PCB pads, and IC pads. With the fanout of FIG. 9A, the patterned conductor 829 (which could be a wide conductor plane) distributes power from PCB pad 832 to the third plurality of vias 827. Likewise, the patterned conductors distribute ground from PCB pad 832 to the third plurality of vias 827. As was further previously described, each RDL may have a differing fanout based upon power and ground distribution requirements at the RDL to support a differing the transition between the first and second lateral separation pitches. Generally, each RDL may have not only a differing patterned conductor pattern but also a differing via density based upon whether it is the first RDL, the second RDL, third RDL, or another RDL.

While FIGS. 8A-8H showed the lateral distances between vias of differing RDLs to be relatively similar in dimensions, this was done only for illustrative purposes. Typical PCB pads 832 and 834 have a lateral separation pitch (second lateral separation pitch) between 0.3 millimeters (300 microns) and 0.8 millimeters (800 microns). Further, the first lateral separation pitch of the IC pads 812 contemplated herein is 40 to 150 microns. The first, second, and third RDL (and/or other RDL) layers must, in combination, support the distribution of power and ground from the plurality of PCB pads having the second lateral separation distance to the plurality of IC pads having the first lateral separation pitch. With the fanout 900 of power and ground of FIG. 9A, PCB pads 832 and 834 have the second lateral separation pitch and the third plurality of vias 827 have a lateral separation pitch 902 having a dimension that may be between the second lateral separation pitch and the first lateral separation pitch. Alternatively, the lateral separation pitch 902 may be the first lateral separation pitch. Thus, according to one aspect of the present disclosure, differing RDLs may having differing fanouts and differing via spacings.

FIG. 9B particularly illustrates a second fanout 950 of power and ground corresponding to the second RDL. Illustrated in FIG. 9B are third vias 827 (transparent view), the second plurality of conductors 825 (which could be a wide conductor plane), and the second plurality of vias 823 (transparent view). The second fanout distributes power and ground from the third vias to the second vias 823 via the second plurality of conductors. With the fanout 952 of power and ground of FIG. 9B, vias 827 have lateral separation pitch 902 and vias 823 have lateral separation pitch 952 that is smaller than lateral separation pitch 902. In one embodiment, the lateral separation pitch 952 may be the first lateral separation pitch. In another embodiment, the lateral separation pitch 952 exceeds the first lateral separation pitch. The principles of FIGS. 9A and 9B may be applied to two, three, or more than three RDLs, with at least one RDL having a fanout that differs from at least one other RDL.

According to a first aspect of the present disclosure, a packaged IC includes a bottom dielectric layer and, on the bottom dielectric layer, a first RDL having a first plurality of patterned conductors and a first dielectric layer. The packaged IC includes, on the first RDL, a second RDL having a second plurality of patterned conductors, a second dielectric layer, and a first plurality of vias that extend through the second dielectric layer between the first plurality of patterned conductors and the second plurality of patterned conductors and, on the second RDL, a third RDL having a third plurality of patterned conductors, a third dielectric layer, and a second plurality of vias that extend through the third dielectric layer between the second plurality of patterned conductors and the third plurality of patterned conductors. The packaged IC includes a plurality of package pads that extend from the third plurality of patterned conductors through the third dielectric layer, power pads and ground pads of the plurality of package pads opening having a first lateral separation pitch. An IC of the packaged IC electrically connects to the plurality of package pads and is encapsulated in an IC encapsulation. A plurality of PCB pads extends through the bottom dielectric layer and contact the first plurality of patterned conductors, power PCB pads and ground PCB pads of the plurality of PCB pads having a second lateral separation pitch that exceeds the first lateral separation pitch.

According to a second aspect of the present disclosure, there is provided a method for creating a packaged IC that includes forming a bottom dielectric layer on a planar carrier, on the bottom dielectric layer, forming a first RDL having a first plurality of patterned conductors and a first dielectric layer, on the first RDL, forming a second RDL having a second plurality of patterned conductors, a second dielectric layer, and a first plurality of vias that extend through the second dielectric layer between the first plurality of patterned conductors and the second plurality of patterned conductors, on the second RDL, forming a third RDL having a third plurality of patterned conductors, a third dielectric layer, and a second plurality of vias that extend through the third dielectric layer between the second plurality of patterned conductors and the third plurality of patterned conductors, forming a plurality of package pad openings that extend from the third plurality of patterned conductors through the third dielectric layer, forming a plurality of package pads that extend into the plurality of package pad openings, power package pads and ground package pads internal of the chip of the plurality of package pads having a first lateral separation pitch, electrically connecting an IC to the plurality of package pads, encapsulating the IC with a protective encapsulant, removing the planar carrier from the bottom dielectric layer, and forming a plurality of PCB pads that extend through the bottom dielectric layer and contact the first plurality of patterned conductors, power PCB pads and ground PCB pads of the plurality of PCB pads having a second lateral separation pitch that exceeds the first lateral separation pitch.

According to a third aspect of the present disclosure, there is provided a method for creating a packaged IC that includes forming a bottom dielectric layer on a planar carrier, securing an IC to the bottom dielectric layer, the IC having a plurality of IC pads opposite the bottom dielectric layer having a first lateral separation pitch, encapsulating the IC with a protective encapsulant, exposing the plurality of IC pads, forming a first RDL on the protective encapsulant, the first RDL having a first dielectric layer formed on the protective encapsulant, a first plurality of patterned conductors formed on the first dielectric layer, and a first plurality of vias that extend through the first dielectric layer from the first plurality of patterned conductors to the plurality of IC pads, forming a second RDL on the first RDL, the second RDL having a second dielectric layer formed on the first RDL, a second plurality of patterned conductors formed on the second dielectric layer, and a second plurality of vias that extend from the second plurality of patterned conductors to the first plurality of patterned conductors through the second dielectric layer, forming a third RDL on the second RDL, the third RDL having a third dielectric layer formed on the second RDL, a third plurality of patterned conductors formed on the third dielectric layer, and a third plurality of vias that extend from the third plurality of patterned conductors to the second plurality of patterned conductors through the third dielectric layer, forming a fourth dielectric layer on the third RDL, forming a plurality of PCB package pad openings that extend through the fourth dielectric layer to the third plurality of patterned conductors, and forming a plurality of PCB pads that extend through the plurality of PCB package pad openings to the third plurality of patterned conductors, power PCB pads and ground PCB pads of the plurality of PCB pads having a second lateral separation pitch that exceeds the first lateral separation pitch.

Optionally, in any of the preceding aspects, at least one of the power PCB pads electrically couples to a respective plurality of power package pads and at least one of the ground PCB pads electrically couples to a respective plurality of ground package pads.

Optionally, in any of the preceding aspects, the first RDL includes a first fanout of power and ground, the second RDL includes a second fanout of power and ground that differs from the first fanout of power and ground, and the third RDL includes a third fanout of power and ground that differs from both the first fanout of power and ground and the second fanout of power and ground.

Optionally, in any of the preceding aspects, the first RDL includes a first fanout of power and a first fanout of ground, the second RDL includes a second fanout of power that differs from the first fanout of power, and the third RDL includes second fanout of ground that differs from the first fanout of ground.

Optionally, in any of the preceding aspects, the first plurality of vias are offset from the second plurality of vias to minimize mounting stress on the IC.

Optionally, in any of the preceding aspects, forming the first RDL on the bottom dielectric layer includes: depositing a first metal seed layer, forming a first patterned resist layer on the first metal seed layer, electrical plating the first patterned resist layer to form the first plurality of patterned conductors, removing the first patterned resist layer and underlying portions of the first metal seed layer to expose the first plurality of patterned conductors and to expose a portion of the bottom dielectric layer, and depositing the first dielectric layer on the first plurality of patterned conductors and an exposed portion of the bottom dielectric layer.

Optionally, in any of the preceding aspects, forming the second RDL on the first RDL includes: forming a first plurality of via openings in the first dielectric layer that extend to the first plurality of patterned conductors, depositing a second metal seed layer, forming a second patterned resist layer on the second metal seed layer, electrical plating the second patterned resist layer to form the first plurality of vias and the second plurality of patterned conductors, removing the second patterned resist layer and underlying portions of the second metal seed layer to expose the second plurality of patterned conductors and to expose a portion of the first dielectric layer, and depositing the second dielectric layer on the second plurality of patterned conductors and an exposed portion of the first dielectric layer.

Optionally, in any of the preceding aspects, forming the third RDL on the second RDL includes: forming a second plurality of via openings in the second dielectric layer that extend to the second plurality of patterned conductors, depositing a third metal seed layer on the second dielectric layer, forming a third patterned resist layer on the third metal seed layer, electrical plating the third patterned resist layer to form the second plurality of vias and the third plurality of patterned conductors, removing the third patterned resist layer and underlying portions of the third metal seed layer to expose the third plurality of patterned conductors and to expose a portion of the second dielectric layer, and depositing the third dielectric layer on the third plurality of patterned conductors and an exposed portion of the second dielectric layer.

Optionally, in any of the preceding aspect, the planar carrier may be removed from the bottom dielectric layer.

Optionally, in any of the preceding aspect, forming the first RDL on the protective encapsulant includes: depositing a first portion of the first dielectric layer on the protective encapsulant, forming a first plurality of via openings in the first portion of the first dielectric layer that extend to the plurality of IC pads, depositing a first metal seed layer on the first portion of the first dielectric layer, forming a first patterned resist layer on the first metal seed layer, electrical plating the first patterned resist layer, removing the first patterned resist layer and underlying portions of the first metal seed layer to form the first plurality of patterned conductors and the first plurality of vias and to expose a portion of the bottom dielectric layer, and depositing a second portion of the first dielectric layer on the first plurality of patterned conductors and an exposed portion of the bottom dielectric layer.

Optionally, in any of the preceding aspect, forming the second RDL on the first RDL includes: depositing a first portion of the second dielectric layer on the first RDL, forming a second plurality of via openings that extend through the first portion of the second dielectric layer to the first plurality of patterned conductors, depositing a second metal seed layer on the first portion of the second dielectric layer, forming a second patterned resist layer on the second metal seed layer, electrical plating the second patterned resist layer to form the second plurality of vias and the second plurality of patterned conductors, removing the second patterned resist layer and underlying portions of the second metal seed layer to expose some of the first portion of the second dielectric layer, and depositing a second portion of the second dielectric layer on the second plurality of patterned conductors and an exposed portion of the second dielectric layer.

Optionally, in any of the preceding aspect, forming the third RDL on the second RDL includes: depositing a first portion of the third dielectric layer on the second RDL, forming a third plurality of via openings in the first portion of the second dielectric layer that extend to the second plurality of patterned conductors, depositing a third metal seed layer on the first portion of the third dielectric layer, forming a third patterned resist layer on the third metal seed layer, electrical plating the third patterned resist layer, removing the third patterned resist layer and underlying portions of the third metal seed layer to create the third plurality of patterned conductors and to expose some of the first portion of the third dielectric layer, and depositing a second portion of the third dielectric layer on the third plurality of patterned conductors and an exposed portion of the first portion of the third dielectric layer.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the disclosure is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A method for creating a packaged Integrated Circuit (IC) comprising:
   forming a bottom dielectric layer on a planar carrier;
   on the bottom dielectric layer, forming a first redistribution layer (RDL) having a first plurality of patterned conductors and a first dielectric layer;
   on the first RDL, forming a second RDL having a second plurality of patterned conductors, a second dielectric layer, and a first plurality of vias that extend through the second dielectric layer between the first plurality of patterned conductors and the second plurality of patterned conductors;
   on the second RDL, forming a third RDL having a third plurality of patterned conductors, a third dielectric layer, and a second plurality of vias that extend through the third dielectric layer between the second plurality of patterned conductors and the third plurality of patterned conductors;
   forming a plurality of package pad openings that extend from the third plurality of patterned conductors through the third dielectric layer;
   forming a plurality of package pads that extend into the plurality of package pad openings;
   electrically connecting an integrated circuit (IC) to the plurality of package pads, the IC having a plurality of power IC pads and a plurality of ground IC pads having a first lateral separation pitch;
   encapsulating the IC with a protective encapsulant;
   removing the planar carrier from the bottom dielectric layer; and
   forming a plurality of Printed Circuit Board (PCB) pads that extend through the bottom dielectric layer and contact the first plurality of patterned conductors, power PCB pads and ground PCB pads of the plurality of PCB pads having a second lateral separation pitch that exceeds the first lateral separation pitch.

2. The method of claim 1, wherein the first lateral separation pitch is in the range of 40 to 150 microns.

3. The method of claim 1, wherein forming the first RDL on the bottom dielectric layer comprises:
   depositing a first metal seed layer;
   forming a first patterned resist layer on the first metal seed layer;
   electrical plating the first patterned resist layer to form the first plurality of patterned conductors;
   removing the first patterned resist layer and underlying portions of the first metal seed layer to expose the first plurality of patterned conductors and to expose a portion of the bottom dielectric layer; and
   depositing the first dielectric layer on the first plurality of patterned conductors and an exposed portion of the bottom dielectric layer.

4. The method of claim 3, wherein forming the second RDL on the first RDL comprises:
   forming a first plurality of via openings in the first dielectric layer that extend to the first plurality of patterned conductors;
   depositing a second metal seed layer;
   forming a second patterned resist layer on the second metal seed layer;
   electrical plating the second patterned resist layer to form the first plurality of vias and the second plurality of patterned conductors;
   removing the second patterned resist layer and underlying portions of the second metal seed layer to expose the second plurality of patterned conductors and to expose a portion of the first dielectric layer; and
   depositing the second dielectric layer on the second plurality of patterned conductors and an exposed portion of the first dielectric layer.

5. The method of claim 4, wherein forming the third RDL on the second RDL comprises:
   forming a second plurality of via openings in the second dielectric layer that extend to the second plurality of patterned conductors;
   depositing a third metal seed layer on the second dielectric layer;
   forming a third patterned resist layer on the third metal seed layer;
   electrical plating the third patterned resist layer to form the second plurality of vias and the third plurality of patterned conductors;
   removing the third patterned resist layer and underlying portions of the third metal seed layer to expose the third plurality of patterned conductors and to expose a portion of the second dielectric layer; and
   depositing the third dielectric layer on the third plurality of patterned conductors and an exposed portion of the second dielectric layer.

6. The method of claim 1, wherein:
   at least one of the power PCB pads electrically couples to a respective plurality of power package pads; and
   at least one of the ground PCB pads electrically couples to a respective plurality of ground pads of the IC.

7. The method of claim 1, wherein:
   the first RDL includes a first fanout of power and ground;
   the second RDL includes a second fanout of power and ground that differs from the first fanout of power and ground; and
   the third RDL includes a third fanout of power and ground that differs from both the first fanout of power and ground and the second fanout of power and ground.

8. The method of claim 1, wherein:
   the first RDL includes a first fanout of power and a first fanout of ground;
   the second RDL includes second fanout of power that differs from the first fanout of power; and
   the third RDL includes second fanout of ground that differs from the first fanout of ground.

9. The method of claim 1, wherein the first plurality of vias are offset from the second plurality of vias to minimize mounting stress on the IC.

\* \* \* \* \*